(12) United States Patent
Jones

(10) Patent No.: US 9,551,468 B2
(45) Date of Patent: Jan. 24, 2017

(54) INVERSE VISIBLE SPECTRUM LIGHT AND BROAD SPECTRUM LIGHT SOURCE FOR ENHANCED VISION

(71) Applicant: Gary W. Jones, Newcastle, WA (US)

(72) Inventor: Gary W. Jones, Newcastle, WA (US)

(73) Assignee: Gary W. Jones, Newcastle, WA (US)

( * ) Notice: Subject to any disclaimer, the term of this patent is extended or adjusted under 35 U.S.C. 154(b) by 342 days.

(21) Appl. No.: 14/262,794

(22) Filed: Apr. 27, 2014

(65) Prior Publication Data

US 2015/0162505 A1 Jun. 11, 2015

Related U.S. Application Data

(60) Provisional application No. 61/913,922, filed on Dec. 10, 2013.

(51) Int. Cl.
*F21K 9/64* (2016.01)
*H01L 33/50* (2010.01)
(Continued)

(52) U.S. Cl.
CPC .............. *F21K 9/64* (2016.08); *F21Y 2101/00* (2013.01); *H01L 25/0753* (2013.01);
(Continued)

(58) Field of Classification Search
CPC F21Y 2101/02; H01L 25/0753; H01L 33/504; H01L 33/507; H01L 33/2924; H01L 33/0002
(Continued)

(56) References Cited

U.S. PATENT DOCUMENTS

| 4,646,743 A | 3/1987 | Parris |
| 5,800,478 A | 9/1998 | Chen et al. |

(Continued)

FOREIGN PATENT DOCUMENTS

| CN | 202871750 U | 4/2013 |
| FR | 2511840 A1 | 3/1983 |

(Continued)

OTHER PUBLICATIONS

Allan, M., "Opportunities in Cancer Therapeutics: Roswell Park Cancer Institute Photodynamic Therapy Patent Portfolio", 2009, pp. 1-4, Publisher: First Principals, Inc., Published in: Cleveland, OH.

(Continued)

*Primary Examiner* — Laura Tso
(74) *Attorney, Agent, or Firm* — Hultquist, PLLC; Steven J. Hultquist

(57) ABSTRACT

A visible light spectrum and light source apparatus are described that provide over 90% of their total radiant power within the 385 nm-530 nm and the 570 nm-820 nm spectral ranges, collectively. The objective of the light spectrum and apparatus is to improve the visibility and shape of a wider range of objects than is practical using conventional LED white light sources at similar radiant power conditions. The new light source can provide good Scotopic or Mesopic at low power levels compared to most other light sources for illumination. One illustrative embodiment of this new spectrum and light source provides a full visible light spectrum with at least 6% of the highest peak radiant power of all wavelengths between 405 nm-730 nm, and another illustrative embodiment provides a similar full spectrum between 440 nm and 730 nm. In both embodiments, the average radiant power in the 475-510 nm cyan spectral region is at least 2-times the average radiant power in the 530-570 nm spectral region.

15 Claims, 5 Drawing Sheets

(51) Int. Cl.
  *H01L 25/075* (2006.01)
  *F21Y 101/00* (2016.01)
(52) U.S. Cl.
  CPC .......... *H01L 33/504* (2013.01); *H01L 33/507* (2013.01); *H01L 2924/0002* (2013.01)
(58) Field of Classification Search
  USPC .................................................. 362/84, 293
  See application file for complete search history.

(56) References Cited

U.S. PATENT DOCUMENTS

| | | | |
|---|---|---|---|
| 5,997,569 | A | 12/1999 | Chen et al. |
| 5,998,925 | A | 12/1999 | Shimizu et al. |
| 6,063,108 | A | 5/2000 | Salansky et al. |
| 6,096,066 | A | 8/2000 | Chen et al. |
| 6,290,713 | B1 | 9/2001 | Russell |
| 7,290,896 | B2 | 11/2007 | Dallas et al. |
| 7,304,201 | B2 | 12/2007 | Holloway et al. |
| 7,517,307 | B2 | 4/2009 | Pokusa et al. |
| 7,646,032 | B2 | 1/2010 | Radkov et al. |
| D623,308 | S | 9/2010 | Kramer |
| 8,113,681 | B2 | 2/2012 | Dallas et al. |
| 8,567,973 | B2 * | 10/2013 | Li ....................... C09K 11/0883 362/231 |
| 2004/0105264 | A1 | 6/2004 | Spero |
| 2004/0127961 | A1 | 7/2004 | Whitehurst |
| 2004/0179283 | A1 | 9/2004 | Jones et al. |
| 2005/0131279 | A1 | 6/2005 | Boulais et al. |
| 2005/0182460 | A1 | 8/2005 | Kent et al. |
| 2005/0278003 | A1 | 12/2005 | Feldman |
| 2006/0030908 | A1 | 2/2006 | Powell et al. |
| 2006/0111761 | A1 | 5/2006 | Butler et al. |
| 2006/0197437 | A1 | 9/2006 | Krummacher et al. |
| 2006/0240277 | A1 * | 10/2006 | Hatwar .................. C09K 11/06 428/690 |
| 2006/0247741 | A1 | 11/2006 | Hsu et al. |
| 2006/0287696 | A1 | 12/2006 | Wright et al. |
| 2007/0167999 | A1 | 7/2007 | Breden et al. |
| 2008/0119913 | A1 | 5/2008 | Powell et al. |
| 2008/0140164 | A1 | 6/2008 | Oberreiter et al. |
| 2008/0172113 | A1 | 7/2008 | Gourgouliatos et al. |
| 2009/0234340 | A1 | 9/2009 | Behrakis |
| 2009/0234341 | A1 | 9/2009 | Roth |
| 2009/0234342 | A1 | 9/2009 | Ely et al. |
| 2009/0234343 | A1 | 9/2009 | Behrakis |
| 2010/0087898 | A1 | 4/2010 | Clement et al. |
| 2010/0165599 | A1 | 7/2010 | Allen |
| 2010/0179469 | A1 | 7/2010 | Hammond et al. |
| 2010/0289044 | A1 | 11/2010 | Krames et al. |
| 2011/0004201 | A1 | 1/2011 | Nuijs et al. |
| 2011/0182072 | A1 | 7/2011 | Shimizu et al. |
| 2011/0228515 | A1 | 9/2011 | Grajcar |
| 2011/0251386 | A1 | 10/2011 | Masuda et al. |
| 2011/0292343 | A1 * | 12/2011 | Papac .................. A61B 3/0008 351/221 |
| 2012/0008217 | A1 | 1/2012 | Ishak et al. |
| 2012/0080615 | A1 | 4/2012 | Kingsley et al. |
| 2012/0255609 | A1 | 10/2012 | Sobue et al. |
| 2012/0293978 | A1 | 11/2012 | Guo et al. |
| 2013/0094036 | A1 | 4/2013 | Itagaki |
| 2013/0134885 | A1 | 5/2013 | Linden et al. |
| 2013/0194794 | A1 | 8/2013 | Kim |
| 2013/0255778 | A1 | 10/2013 | Okaniwa et al. |
| 2013/0344454 | A1 | 12/2013 | Nath |
| 2014/0055982 | A1 * | 2/2014 | Tao ........................ F21V 9/16 362/84 |
| 2014/0301062 | A1 * | 10/2014 | David ...................... F21K 9/56 362/84 |
| 2014/0312376 | A1 * | 10/2014 | Wilcox .................. H01L 33/504 257/98 |

FOREIGN PATENT DOCUMENTS

| | | |
|---|---|---|
| KR | 10-1036598 B1 | 5/2011 |
| WO | 2008041138 A2 | 4/2008 |
| WO | 2009115574 A1 | 9/2009 |
| WO | 2011008881 A2 | 1/2011 |
| WO | 2011048458 A1 | 4/2011 |
| WO | 2011120172 A1 | 10/2011 |
| WO | 2011132125 A1 | 10/2011 |
| WO | 2012021460 A2 | 2/2012 |
| WO | 2012025399 A1 | 3/2012 |
| WO | 2012042415 A1 | 4/2012 |
| WO | 2012134992 A2 | 10/2012 |
| WO | 2012168395 A1 | 12/2012 |

OTHER PUBLICATIONS

Unpublished U.S. Appl. No. 14/217,356, filed Mar. 17, 2014.
Unpublished U.S. Appl. No. 14/217,418, filed Mar. 17, 2014.
Uvbiotek LLC, "Phototherapy systems designed to fit the way you live.", 2006, pp. 1-6, Published in: North Fort Myers, FL.

* cited by examiner

INVERSE VISIBLE SPECTRUM LIGHT AND BROAD SPECTRUM LIGHT SOURCE FOR ENHANCED VISION

CROSS-REFERENCE RELATED APPLICATION

The benefit of priority under 35 USC 119(e) of U.S. Provisional Patent Application No. 61/913,922 filed Dec. 10, 2013 in the name of Gary W. Jones for "INVERSE OF VISIBLE SPECTRUM LIGHT SOURCE FOR ENHANCED VISION" is hereby claimed. The disclosure of U.S. Provisional Patent Application No. 61/913,922 is hereby Incorporated herein by reference, in its entirety, for all purposes.

FIELD

The present disclosure relates generally to a new type of light source for illumination that generates unique non-naturally occurring spectra of light in the visible spectrum range, primarily using LEDs and spectrum-converters. Product categories using this type light spectrum and light source include general purpose lamps, reading lights, body-mounted lights, flashlights, lanterns, architectural lighting, retail product lighting, signaling lights, horticultural lighting, and many other lighting products.

BACKGROUND

A great many Light Emitting Diode (LED) devices and light sources exist that generate light for illumination of objects primarily for direct vision by the human eye. Product categories include lamps for architectural lighting, retail and office product lighting, body mounted illumination lights, flashlights, lanterns, reading lights, streetlights, medical and dental uses, home lighting, automotive lighting, and many other lighting products.

For reference, there are also illumination systems for electronic imaging sensors that function at the edge of human vision or well outside of the human vision spectral and intensity capability range such as infrared and thermal imaging or ultraviolet light imaging outside of the direct-imaging sensitivity range of normal biological eyesight.

In illumination systems, LED light sources can provide a high degree of longevity, reliability, low cost per radiant-watt of light, and a wide selection of spectral characteristics.

Illumination approaches to lighting for vision with LEDs frequently seek to enhance the green-yellow 530-570 nm spectral range because this spectral range provides the highest "specification value of lumens" for a given input electrical power or radiant power. Lumens has become a common metric for measuring light intensity, but this metric provides actual radiant power convolved with the CIE's assessment of the human eye's color sensitivity curve. The use of "Lumens" as a consumers' primary metric for assessing light output capability of lighting products has resulted in much of the LED lighting industry evolving toward light sources that maximize "Lumens" and not maximizing light output for quality of vision.

Warm-white light LEDs are an improvement on cool-white LEDs for general illumination because they increase the valuable red component of the light spectrum. These lamps usually utilize added orange and/or red emitting phosphor(s) (typically 590-620 nm emission peak phosphors) to the white LED phosphor(s) or add orange-red 620-630 nm dominant emission peak LEDs. An example of where warm-white or even pink-tinted LEDs are especially important for illumination is when meat or bakery goods are being presented to consumers. Many retail display cases that were initially converted to cool white LEDs to save energy resulted in customer and retailer dissatisfaction due to lack of sufficient red light in the spectrum making meats, fish, and breads appear unappealing, and therefore have been or are being changed to warm-white or even pink lights with a moderately high orange and red spectral content.

There are numerous special-application exceptions to the use of white light for illumination using LEDs. These applications include red LEDs being used for dark-adapted vision or signaling, blue and/or cyan and red LEDs for identifying blood, cyan LEDs for making certain patterns stand out, green lights for use in greenhouses so as to not initiate certain photoactivation processes, ultraviolet or deep violet LEDs for making objects to fluoresce and stand out, and a few other specialty applications. These are all narrow and specific lighting applications.

As discussed in the definitions hereinafter, "Lumens" is a derived unit of luminous power, providing a measure of the total amount of "visible" light emitted by a light source. Luminous power reflects the varying perception of the "average" human eye to different wavelengths based on the Luminosity Function standard established by the Commission Internationale de l'Éclairage (CIE) in 1931 for the human eye's sensitivity. This function provides an average spectral sensitivity of human visual perception of brightness based on a non-representative sampling of the human population. The Luminosity Function standard was determined using subjective judgments by selected participants who indicated which of a pair of different-colored lights is brighter, to describe relative sensitivity to light of different wavelengths. The CIE luminosity function is a standardizing function used to convert "radiant energy" into luminous (i.e., "visible") energy.

Light that is close to or outside the CIE defined visible light spectrum limits of the 400 nm to 700 nm range provides virtually no measured Lumens, regardless of light's actual radiant power or the fact that most people can easily detect light wavelengths far beyond the CIE spectral range illuminating white surfaces even at well under 1 mW/cm$^2$ radiance. These "outside of the CIE range" wavelengths are present in many types of non-LED light sources and some LED light sources, contributing useful radiant power in view of the fact that most people easily perceive these wavelengths (unless color blind to certain spectra). Incandescent light sources predominantly provide these near-infrared wavelengths of light as well as longer wavelengths far into the infrared. Visible light is defined as the approximate range within which most people can see reasonably well under most circumstances. Various sources consider visible light as broadly as from 375 nm to 800 nm. Under ideal conditions, many people can even visually perceive light from under-330 nm to over-950 nm. The vast range of objects in the world that are being illuminated reflect light or are activated to fluoresce over a wide range of range wavelengths unrelated to the CIE curve.

Human eyes are generally several times less sensitive to 390 nm-400 nm violet light or to 700 nm-730 nm deep-red light than they are to 530 nm-570 nm range yellow-green light. Illumination light intensity, the light source spectrum, light angles, polarization, reflected or emitted light intensity from objects of interest, background and surroundings, and individual perception of light spectra all effect people's ability to visually detect objects using a selected light source. There have been publications on the subject of human vision range showing actual human vision ranging from 330 nm up to over 1000 nm, but some of the more recent publications where extensive subject sampling was performed put "useful" human vision into at least the 375-750 nm range, depending on how the experiments were performed and the test subject criteria (illustrative references include (375 nm-750 nm): Curtis, Barnes. Invitation to Biology: Fifth Edition. New York: Worth Publishers, 1994: 163, and (375-780 nm): Lapedes, Daniel. Dictionary of Scientific & Technical Terms: Second Edition. New York: McGraw Hill, 1978: 954.)

Color Rendering Index (CRI) has recently begun to be emphasized for general LED lighting to correct for some of the problems originating from the extensive use of lumens as the only light output metric. Several versions of CRI as an added metric have been used for some time in photography, although there are also other standards. CRI provides a quantitative measure of the ability of a light source to "reproduce the colors of various objects" faithfully in comparison with their concept of an "ideal" or "natural" light source. Unfortunately, a variation of the flawed CIE assessment of human eye spectral range was also applied to CRI metrics in determining the spectrum of an "ideal" light source. Therefore, objects absorbing or returning light to the eye outside the CRI range are considered almost invisible, and can almost become invisible if illuminated using a light source providing a center of the CIE curve shaped light spectrum. While adding CRI as a metric is better than using lumens alone, and although CRI can be useful for display applications where subjects are effectively looking at the light source, CRI can also be very misleading if used in the selection of LED lighting for many non-reflective surface illumination applications.

If the eye is less sensitive to light in a portion of a spectral range, increasing the relative intensity of light in these lower optical sensitivity spectral ranges increases the probability of detection of objects that absorb or reflect primarily in such portion of the light spectrum. Many materials may also fluoresce in the visible range after absorbing light, affecting their visibility. The eye can perceive the light returned directly from the object, and light returned from other nearby or background objects. Coatings on objects such as water, oils, or wax can also influence the probability of visual detection of objects.

LEDs are available providing light spectra more closely approximating various embodiments of the "simulated-sunlight" spectrum, or mimicking incandescent light. Black body light spectrum or fluorescent lighting can provide a better range of colors and can make the color of objects appear more "normal". Reasonable sunlight ("visible" part of the spectral range) and other recreations of natural spectra have been shown. Light spectra similar to sunlight can recreate and "resolve" colors as they would appear in sunlight, especially if the lamps also contain considerable ultraviolet light. The presence of UV in sunlight or a simulated spectrum can activate fluorescent effects in many materials that also greatly affect perceived color.

Most LED light source products in the market create white light consisting of one or more blue 440-470 nm spectral range LEDs with one of more spectrum converters (usually phosphors) mixed into a translucent medium and placed over the LED, usually as a coating on the LED. This spectrum converter usually consists of YAG phosphors with predominantly 530-580 nm light emission peaks in a polymer, glass, or silicone medium. The phosphor spectrum converter may or may not have additional phosphors added. Red phosphors such as AlGaAs, GaAsP, GaN, GaP, and/or AlGaInP are frequently added to increase the red spectral content and create warm-white LEDs.

Single narrow spectrum wavelength LEDs such as red, blue, green, or cyan are used in many lamps as special vision modes or for entertainment, stage lighting, displays, back-lighted control panels, signaling and flashing. Colored lights are seldom used for general illumination.

Mixing of different dominant emission peak types of LEDs is well known for tailoring specific light spectra. Red (usually this is an orange 620-630 nm dominant emission peak LED), green, and blue LEDs are commonly used at different relative intensities to create a wide range of colors by electronically control of fixed color light sources.

A great many LED configurations are known with the phosphors or dyes coated onto the LED or remotely placed in the exiting light path. Concentrations of spectrum converters in a medium, on a surface, or on a reflector can vary, depending on the length of the light path, the percentage of incoming light to be absorbed, and the output light spectrum that is desired.

Optical absorbing filters or reflecting filters (interference filters such as dichroic filters or absorbing-only dyes or pigments) are sometimes used to remove or reflect portions of the output light spectrum at the expense of losing the energy associated with the portion of the spectrum that is removed. Commonly seen examples of filtered light are in stage lighting, automobile tail and running lights, indicators and control panels.

Dyes, phosphors, and/or pigments are used as fluorescent, phosphorescent, and other spectrum converters in various media, to shift light spectra and reshape the light energy distribution in light spectra. These media containing spectrum-shifting materials have been shaped into lenses, coated onto reflectors, and formed into a wide variety of shapes in the light path. Photonic arrays such as photonic crystals and nanoparticles such as quantum dots or rods in or on various media or reflectors have also been used to modify light spectra with less energy loss than absorbing or reflecting only filters, or to shift a spectrum to longer wavelengths (or to shorter wavelengths using 2 photon materials).

Most white light LED lamps provide a spectrum of cool white or warm white light. These lamps contain blue light, and blue light that has been converted using phosphors to green light and to orange-red light wavelengths, with a small percentage of the light spectrum in the red. There is also usually a gap in the cyan (475-510 nm) spectral region of most white light LED lamps between the blue emission of the LED that is passed by the phosphor, and the phosphor emission peaks in the yellow-green, yellow, or orange spectral regions. A low radiance of 480 nm-510 nm cyan light is present in conventional white light LED lamps, relative to 550 nm-570 nm yellow or ~450 nm blue. Since cyan is the spectral region where the eye's rods are most sensitive, this creates an issue that did not exist with natural light or most other pre-LED light sources. Red phosphors have become available using GaN that can provide deeper red such as 650 nm or 670 nm. Phosphors, dyes, and QDs are known that can provide long wavelength light emission. See, for example, the Intermatix and Bejing Yuji examples discussed elsewhere in this disclosure.

Full-visible-light-spectrum LED-based lamps have been demonstrated that simulate the profile of the sun's spectrum with a high relative green-yellow (520 nm-590 nm) light intensity (relative to other parts of the spectrum), utilizing multiple LEDs and phosphors and/or other spectrum converter materials. Examples of this approach are described in U.S. Pat. No. 5,998,925.

LED light sources using UV LEDs and other UV light sources have been used with phosphors and other color converters to generate violet light and light in most other portions of the visible light spectrum.

Many full-visible-spectrum lamps use multiple LEDs (including orange-red, red, green, and sometimes violet LEDs) and some phosphor coated LEDs. This approach has resulted in better lamps, but such lamps still have multiple weak intensity voids in the visible light spectrum, and/or require six or more types of LEDs to be mixed. Mixing large numbers of different LEDs can be costly, since different LEDs frequently also require different electrical bias conditions and the resultant level of assembly complexity can become very high.

LED lamps also are widely available that provide special colors or mixtures of different spectral ranges of light. Blood tracking lights are just one example of a special spectrum, and are designed to highlight fresh blood using a combination of blue and orange-red wavelengths of light. Examples are described in Fiskars U.S. Pat. Nos. 7,290,896; 7,517,307; and 8,113,681. Blood tracking lights use a mixture of different wavelength LEDs in red and blue, including cyan. These special-purpose lights typically contain very little light in several portions of the visible spectrum, and thus are not appropriate for maximum detection of the widest range of objects.

LED lamps that provide large amounts of blue light and red light relative to green-yellow light are used for horticultural lighting. These LED lights sometimes also include a few conventional white light LEDs, but their spectra usually contain very little green-yellow light since this spectral range is not significantly utilized by most plants. Therefore, most green plants appear almost black under these light sources. These lamps typically use six-or-more types of LEDs in combination and seldom contain color converters. All horticultural LED lamps have one or more very weak spots in visible spectrum, where the light intensity is less than 9% of the highest photon power in the lamps' spectrum. These spectral gaps are frequently intentional for energy efficiency or due to small spectral gaps that can occur between various narrow emission spectra LEDs.

The human eye's color-sensing cones are collectively most sensitive to the yellow-green part of the spectrum. The commonly used light output measurement system of lumens weighs this yellow-green spectral range light heavily. A focus on maximizing lumens, as a guide for illumination lamp development, is at least partly flawed. The search for lumens instead of radiant power leads LED makers to introduce or accept spectral weaknesses in the output visible spectrum of the lamps. Since a great many objects in the overall world are not mostly yellow-green reflecting, providing the maximum radiant power in the 530-570 nm spectral range is flawed for many vision-oriented illumination applications in which the illumination light intensity may be low and detection of the maximum number of object types is the only objective. Lumens as a metric is best suited for predicting relative brightness to the eye when looking directly at the light source, or when illuminating objects that are highly reflecting in the 500-600 nm spectral range.

Flat-spectrum LEDs and sunlight-spectrum simulating LED lamps partly address the issue of missing portions of the visible spectral range, since the entire visible spectrum may be provided. See, for example, U.S. Pat. No. 7,646,032, U.S. Patent Application Publication 20100289044, and U.S. Patent Application Publication US20130134885. However, these lamps provide excessive amounts of light energy in the yellow-green spectral range where the eye is most sensitive. Sunlight, flat spectrum, incandescent, and other LED light sources that simulate other common light sources are best when multiple people need to agree on the color of objects. However, these conventional light spectra are not the most energy-efficient solutions for basic visual detection of the widest range of objects and assessing their shapes in low light intensity situations such as are frequently encountered, especially when using small battery-operated mobile outdoor lighting devices (flashlights, lanterns, body mounted lights, bicycle lights, etc.).

Commercial white LEDs are weak in the 480 nm-500 nm cyan portion of the spectrum where the eyes' rods are most sensitive and used for dark-adapted vision (Scotopic vision), relative to the 530 nm-570 nm portion of the spectrum. The eyes' rods play a major role in visual acuity, especially in low light situations. The concentration of rods is highest in the macula of the eye. High night vision capability animals typically have higher concentrations of rods in their macula than humans. Cyan LEDs are primarily used for special purpose lighting such as all-cyan lamp forensics, blood lights with orange-red and blue LEDs, and in combination with red LED light for high visibility yellow traffic lights. Cyan LEDs are not used in white lighting, even though they can improve visual acuity. This oversight is attributable to a blind focus by lamp designers on only providing the most "lumens", and not on providing the best quality of full spectrum light.

No light sources have been demonstrated that provide a full visible spectrum of light with over 1.5× enhanced radiant power in both the deep-red and violet spectral intensity components relative to the 530-570 nm green-yellow part of the spectrum, and enhanced light intensity in the cyan 480-510 nm range that is greater than the highest radiant power anywhere in the 530-570 nm spectral range.

No light sources have been demonstrated that specifically target (1) providing light over the full visible spectrum from 405-730 nm, and (2) providing over 1.5-times enhanced higher relative light intensity specifically in the 405-430 nm spectral range, the 630-700 nm spectral range, and the 470-510 nm spectral range, relative to the middle yellow-green 530-570 nm portion of the light spectrum.

No light sources have been demonstrated that specifically target (1) providing light over the visible spectrum from 440 to 730 nm or longer wavelengths, and (2) providing over 1.5-times relative light intensity specifically within the 630-730 nm spectral range, and the 470-510 nm spectral range, relative to the yellow-green 530-570 nm portion of the light spectrum.

Light sources with UV, violet, blue, and/or cyan LEDs have been disclosed that have phosphors and/or other color-converting materials in a wide variety of configurations. See, for example, International Publication WO2011120172A1 and Chinese Patent Publication CN 202871750 U.

Up to 85% and higher internal QY red phosphors are available, while lower cost red phosphors have under 60% internal QY. Light scattering by phosphor particles and absorption losses can cut the output light efficiency by another 20% to 50%, depending on the amount of phosphor used, the medium, and the overall design used due to internal scattering by phosphor particles, trapped light, misdirected light, and other losses. QDs and some other nanoparticles can provide higher internal conversion efficiency and are less scattering-prone than standard phosphors, but also entail higher cost. Mixtures of different phosphors and/or QDs have been used to create multiple types of specific light sources.

Fluorescent dyes can have low internal scattering losses in many transparent media since the dyes are molecular in size (as long as dye aggregation is minimal). A few red-emitting dyes exhibit over 90% QY, and therefore dye-based lamp systems can be up to two times as efficient as typical particle phosphor systems, if over 80% of the light is to be converted to the orange and red spectral range, if the Stokes shift is adequate, if light trapping is controlled, and if the photostability of the dyes is adequate for the application. Fluorescent dyes are typically not used in commercial LEDs, as it has not been previously demonstrated how to accomplish these combined objectives using available dyes in reasonable media. Photostability issues are usually present, and the Stokes shift is usually small, so most red emitters tend to absorb poorly in the violet-blue where most of the more efficient LEDs reside, and because of the need for some blue light in most white light spectra. See, for example, International Publication WO/2012/042415, describing the use of dyes with LEDs.

Dyes may aggregate into groups of molecules, or bond with the medium used to contain it. Such effects typically reduce QY, and cause the dyes to remain dispersed rather than dissolved in a medium, so that the medium contains some combination of both dye aggregates and non-aggregated dye molecules. Proper dye-medium compatibility, dye-medium mixing, and processing of the dye-medium mix is important for the achievement of high QY.

Non-fluorescent dyes are sometimes used as filters to absorb portions of the light spectrum to provide more pure visual color, but absorption filtering wastes a significant amount of light energy and is therefore usually undesirable for practical applications unless it is to block UV or long wavelength IR, or otherwise represents the only way to achieve a desired light spectrum at reasonable cost.

Biological applications for fluorescent dyes, quantum dots, and phosphor-like nanoparticles have included tagging and tracking of biological materials, and use as photosensitizers or in photodiagnostic systems. Photoacoustic applications are also known.

The art therefore continues to face unresolved needs in the generation of visible light spectra, and particularly in the creation and use of such spectra to achieve improved visual acuity and enhancement of visualization processes.

SUMMARY

A visible light spectrum and light source apparatus are provided in which over 90% of total radiant power is within the 385 nm-530 nm and the 570 nm-820 nm spectral ranges, collectively. The objective of the light spectrum and apparatus of the present disclosure is to improve the visibility and shape of a wider range of objects than is practical using conventional LED white light sources at similar radiant power conditions. Light sources of the present disclosure enable good Scotopic or Meopic capability to be achieved at low power levels as compared to most other illumination light sources.

In various implementations, as hereinafter more fully described, this new spectrum and light source provides a full visible light spectrum with at least 6% of the highest peak radiant power of all wavelengths between 405 nm-730 nm, with other implementations providing a similar full spectrum between 440 nm and 730 nm. In both embodiments, the average radiant power in the 475-510 nm cyan spectral region must be at least 2-times the average radiant power in the 530-570 nm spectral region. This 475-510 nm cyan spectral range is where the rods in the eye are most sensitive, but conventional white LEDs provide low radiance over most of this spectral region. The average radiant power in the 530 nm-570 nm spectral range is restricted to over 6% but under 45% of the highest radiant power peak in the overall output light spectrum.

The light sources of the present disclosure enhance the visibility of objects that absorb, reflect, or emit violet, blue, and/or red light relative to other LED lamps, providing higher relative radiant power in the light spectrum to compensate for the collective lower sensitivity of the eye's cones to shorter and longer wavelength spectral ranges of light. These spectra and associated illuminators also provide higher relative spectral radiance in the 475 nm-510 mn cyan spectral region where the eye's rods are most sensitive, relative to conventional white LEDs, thereby enhancing visual acuity. These spectra and lamps are correspondingly less likely to overwhelm the eye with excessive yellow-green light where the eye's cones are collectively the most sensitive and result in color or image wash-out.

This new class of light spectrum is created using light sources that employ specifically adapted spectrum-converting structures.

In one aspect, the present disclosure relates to a light spectrum comprising a non-naturally-occurring, non-transitory visible light output of a light source comprised of primarily LED elements with spectrum-converting materials and/or structures(s), wherein the light source is configured to provide at least one light output mode with visible light spectra output comprising (a) a light spectrum generated by at least one primarily-LED or totally LED-driven light source and having the following characteristics (A)-(H), and (b) a primarily LED driven source to generate such visible light spectrum:

(A) at least one of (i) radiant light power in the output spectrum covering the entire 440 nm-730 nm portion of the visible light spectral range, with radiant power of all individual wavelengths in this range being at least 6% of the highest radiant power peak in such range for light sources not primarily driven by violet spectral range radiant light power from LEDs, or (ii) radiant light power over the entire 405 nm-730 nm portion of the visible light spectral range, with radiant power of all wavelengths in this range being at least 6% of the highest radiant power spectral peak in such range for light sources that are primarily or driven by violet spectral range radiant light power from LEDs;

(B) two of the three highest radiant power emission spectral peaks are between 630 nm-730 nm and/or between 385 nm-465 nm, and radiant power of each of these radiant power spectral emission peaks is at least 1.5-times the highest radiant power or the average radiant power light output within the 530 nm-570 nm spectral range;

(C) the highest radiant power peak within the light spectrum of this light source is at least twice the highest radiant power at any point within the 530 nm-570 nm spectral range;

(D) the average radiant power intensity over the 480 nm-510 nm spectral range is at least 1.5-times the average radiant power in the 530 nm-570 nm spectral range;

(E) the highest radiant power at any point within the 530 nm-570 nm spectral range is equal to or less than 45%, but also more than 6%, of the highest radiant power peak in the overall emission spectrum of at least one light source;

(F) the radiant light power at any individual wavelengths in the ultraviolet under 375 nm is less than 6% of the highest radiant power peak in the 400 nm-730 nm portion of the emitted light spectrum;

(G) the radiant power at any individual wavelengths over 820 nm and under 1500 nm must be less than 6% of the highest spectral emission peak in the 405 nm-730 nm portion of the output light spectrum; and (H) the light spectra that are created when one or more 375 nm-415 nm dominant peak violet LEDs are included and when turned on in the light source must provide violet light at all wavelengths in at least the 405 nm-440 nm spectral range using a spectrum converter with no more than 2 different dominant peak emission types of violet LEDs, with the proviso that if this light source is primarily driven using violet radiant light power from one or more violet LEDs, then at least 15% of the highest violet-light radiant power peak radiant power must be present at all violet to blue-violet light wavelengths from this light source between 405 nm-440 nm in at least one operational mode.

Another aspect of the disclosure relates to a light source configured to generate the above-described light spectrum.

Other aspects, features, and advantages of the disclosure will be more fully apparent from the ensuing description and appended claims.

DESCRIPTION

Figure 1:
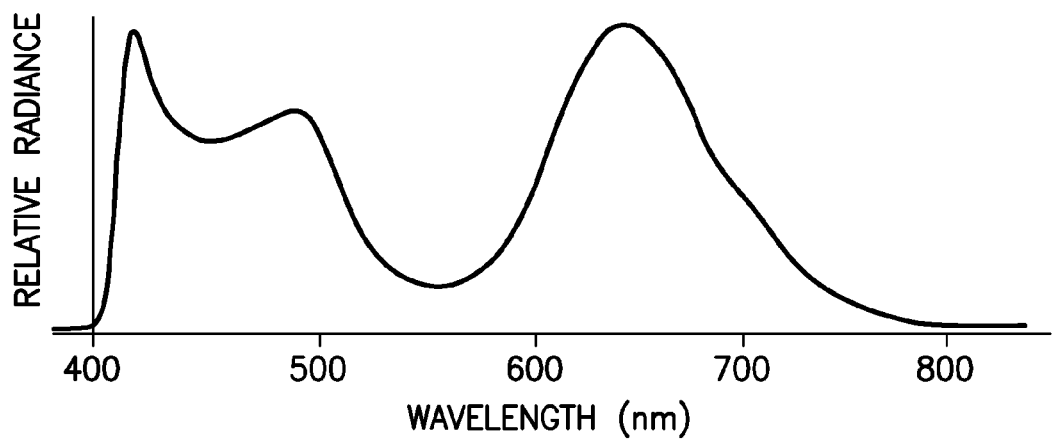
FIG. 1 is a graph of Relative Radiance, as a function of Wavelength, in nanometers, for a spectrum produced by a light emission assembly using one violet LED with two spectrum converters.

As used herein, the following terms have the following meanings:

"LED" commonly refers to Light Emitting Diodes that are semiconductor-based. In this disclosure LED is used to also mean semiconductor diode lasers, organic light emitting diodes (OLEDs), and other light emitting devices.

"CIE" means the Commission Internationale de l'Éclairage. See discussion of Lumens below.

"Lumens" is a derived unit of luminous power, providing a measure of the total amount of "visible" light emitted by a light source. Luminous power reflects the varying perception of the "average" human eye based on the Luminosity Function standard established by the Commission Internationale de l'Éclairage (CIE) in 1931 to different wavelengths. This Luminosity Function was determined based on pre-1931 assessments of average spectral sensitivity of human visual perception of brightness.

"Radiant Power" is a pure measurement that indicates the total power of all electromagnetic waves emitted, independent of an individual's eye's ability to perceive the light. Radiant energy per unit time, also called radiant power.

"$\epsilon$" is extinction coefficient in $M^{-1}$ $cm^{-1}$. "Extinction" shown as the symbol epsilon ($\epsilon$) refers to the probability of a dye or other material absorbing photons at a specific wavelength. A higher number means a higher probability of absorbing photons.

"Light colors" For the purposes of this discussion, the following "color" definitions will be used. Some of these designations are not standard conventions for color representation (especially Red and Violet), but spectral color change is gradual so assigning "hard" color range cutoffs is somewhat arbitrary. Most such designations of color vary considerably by study or publication, and significant variations in color perception by individuals are well documented, so these definitions are of a reasonable character. Spectral wavelengths are listed below in order of low to high photon energy.

"Near-IR" Near-Infrared spectral range light (730-950 nm, this light is visible to-barely visible as "Red" to most people at moderate-to-high light radiance). Red to near-IR at 730 nm is not a clear transition, depends on test methods, and varies considerably by individual.

"Red" Red, including Deep-Red spectral range light (630-730 nm)

"Orange-Red" 620-630 nm spectral range light

"Orange" 590-620 nm spectral range light

"Yellow" 550-590 nm spectral range light

"Yellow-Green" 530-570 nm (Cone receptor maximum spectral sensitivity range)

"Green" 510-550 nm spectral range light

"Cyan" 470 nm-510 nm spectral range light. Cyan can appear blue or green. Rod receptor maximum spectral sensitivity range. (470 nm-490 nm=blue-tint-cyan and 490 nm-510 nm=green-tint-cyan)

"Blue" Blue spectral range light (430-470 nm)

"Violet" Violet spectral range light (non-UV) (385-430 nm)

"UV" Ultraviolet spectral range light (300-385 nm)

"Magenta" Not a spectral color—typically a mixture of blue and/or violet light combined with red spectral range light "Pink" Not a spectral color—typically a mixture of blue and/or violet, a small amount of yellow and/or green, and red spectral range light "White" Not a spectral color—typically a mixture of red, green, and blue, but can contain many other wavelengths of visible light, including all wavelengths, so that the light appears white. White light may have color tints depending on the balance of light radiance in the spectrum. Yellow, orange, or pink tints are usually considered warm. Blue, green, or no tints are considered cool. Very high radiance light of most visible light colors usually appears white to the eye.

"Visible Light" In this discussion "Visible Light" refers to the spectral range between 375 nm to 850 nm where most people can readily detect at over 0.1 W/cm² radiance. The spectral range greatly exceeds the CIE-defined visible light range of 400 nm-700 nm so it can include people with higher relative perception of short or long wavelength light. While many people can also perceive light wavelengths in the UV below 400 nm and beyond 730 nm at moderate-to-high radiant power, this non-UV visible light spectral range is used as an estimated >80% of the human population visual spectral range.

"QY" Quantum Yield—This is defined here as the ratio of emitted photons/absorbed photons from a material for a specific excitation spectrum. It is provided as a percentage without units.

"QD" Quantum Dots are nanoparticles with multiple layers instead of single composition crystal particles as in phosphors. As photoluminescent materials, they behave similarly to phosphors, but can be more efficient, and highly selected QDs of the same structure can exhibit more narrow emission spectra.

"Phosphor" This term is generally used to refer to inorganic photoluminescent materials (fluorescent or phosphorescent) that are generally used as small crystalline particles that appear like a powder before mixing. For simplicity in this discussion, the use of "phosphor" is generalized to encompass all particle-based photoluminescent materials, which includes quantum dots, other spectrum-converting nanoparticles and their conjugates, and other fluorescent or phosphorescent materials other than organic fluorescent or phosphorescent dyes.

"Dye" In this discussion, the term "dye" is used to refer to fluorescent or phosphorescent materials that are mostly distributed at a molecular level in solutions (e.g., polymers, sol gels, low temperature glasses, liquids or gels, and other translucent materials in a wide variety of shapes). Dyes here primarily include organic dyes that are dissolved in polymers or other media and then formed into particles, even though they may be used for similar purposes as phosphors or QDs.

"Spectrum Converters" This term covers a wide range of structures that contain dyes, phosphors, photonic structures, and/or quantum dots and other nanoparticles that absorb one spectral range of light and emit a different spectral range of light. These absorbed and emitted light spectral ranges can overlap. The chemical or particulate spectrum converter components can be pure or mixed and can be suspended in a "medium" constituted of any of a variety of polymers and/or other translucent medium materials such as silicones, silicates, sol gels, glasses, polymers, etc. Spectrum converters can be coated onto surfaces or shaped into structures such as lenses or formed into sheets, rods, fibers, and many other structures. These materials can be layered, mixed together, or used with just one converter type in the medium. Specific spectrum converter materials are best suited for certain types of media, which is generally available information from most spectrum converting materials suppliers such as phosphor or dye suppliers. Spectrum converters can also contain filters and/or reflectors such as interference filters or mirrors.

"Medium" refers to translucent materials that can contain spectrum converters constituted of any of a variety of polymers and other translucent medium materials such as silicones, silicates, glasses, sol gels, polymers, etc., and that can be painted on surfaces or shaped into structures such as lenses, columns, beads or particles, or sheets.

"LT Glass" is low-temperature melting glass, which is glass with a glass transition temperature typically below 500° C. if it is to be used with high temperature stable organic dyes. For use with inorganic pigments, QDs, and/or phosphors, the glass transition temperature can be much higher, depending on the phosphor and glass formulation used.

"nm" Nanometers ($10^{-9}$ meters length)

"μm" Micrometers ($10^{-6}$ meters in length)

The present disclosure relates to a visible light spectrum and a light source apparatus that can emit over 90.0% of its total radiant power in at least one operational mode within the 375 nm-530 nm and the 570 nm-780 nm spectral ranges.

Specifically, this new type light spectra uniquely provides light radiance peaks in the over-580 nm and under-560 nm spectral ranges, and an average power in the 480-505 nm spectral range that is over 1.5-times greater the average radiant power in the 530-570 nm yellow-green spectral range.

While many natural sunlight spectra and specialty lights for vision-oriented illumination may exhibit higher radiant light power in both the red and blue-violet portions of the spectrum, these spectra do not exhibit the characteristic of also producing a light spectrum containing the multiplicity of emission peaks in the 630 nm-800 nm orange-red light radiant power range AND peaks in the under-665 nm blue or violet radiance power range AND over 1.5-times higher average higher radiant power within most of the 475 nm-505 nm portion of the emitted light spectrum than is present in the 530-570 nm portion of these other light spectra. All of these criteria are accommodated by the light spectrum of the present disclosure.

"Mesopic vision," where both rods and cones are functional at medium-to-low luminance levels, is a primary target illumination-zone objective for the present invention. A goal is to obtain near-optimal wide-range of object detection with good overall vision quality for object shapes and color-contrast when using moderately-low power light sources in battery-operated outdoor applications. I have found that this goal is accomplished using the new light spectra provided herein that cover most of the visible spectral range and that provide high relative mid-cyan (480 nm-410 nm) spectral range light intensity and high wide-spectral range red (580-730 nm) radiant light spectral content. Variations of such spectra and associated light source technology are also potentially useful in a great many general home, reading, medical, industrial, business, and other applications, even when used at photopic or scotopic radiant illumination intensities.

The new "Inverse Spectrum Light" of the present disclosure for illumination is counter-intuitive relative to current practice in lighting for illumination, and is significantly different from both natural light sources and all other man-made full-spectrum light sources heretofore used for enhanced vision illumination. This Inverse Spectrum Light concept requires using less relative radiant light power where the cones of the eye are most sensitive and more light power where the cone are less sensitive, while still providing a substantial amount of relative light power in the spectral range where the eyes' rods are most sensitive to improve visual acuity. In addition, this new light source provides a boost of light radiance in the cyan spectral region where the eyes' rods are most sensitive to light, for enhancing visual acuity in dark conditions. Cyan and blue light are also reported to increase alertness (see, e.g., *Light: Science & Applications* (2014) 3, e141; doi:10.1038/lsa.2014.22, published online 14 Feb. 2014).

Even though the eye can be most sensitive to cyan light when a person is dark-adapted (Scotopic zone), direct exposure to high radiance light (any visible spectral range light, and especially cyan light where the rods are sensitive) can quickly reduce the sensitivity of the eyes' rods because the rods can virtually shut down for 10-25 minutes after bright light exposure and night vision can be significantly reduced. Therefore these new light spectra and light sources are primarily for illumination at radiant light intensities that are returned to the eye from the environment where the rods are still active (Scotopic or Mesopic).

In the mesopic zone with both rods and cones active, the new lights of the present disclosure can provide the greatest low-power per unit area illumination for good vision and detection of a very wide range of color-contrast and types of objects, relative to conventional white-LED lighting. If frequent exposure to highly reflective surfaces or other high-cyan lights is likely, using an inverse mode with lower cyan radiance range may be more beneficial, but even in high apparent brightness situations where the eye is in the photopic state, these new spectra and associated light sources can provide enhanced vision and added value.

The lamps of the present disclosure will typically exhibit far lower measured "Lumens" of output than conventional white LED light sources (such as cool white or standard warm white LED light), even though the output light radiance and output photon flux may be equivalent from these new light sources. This is because of the more complete spectrum in the cyan region, and/or the increased full-violet spectral coverage.

Other LED lamps that include violet LEDs use for more violet or UV types of dominant peak LEDs that leave significant relative radiance troughs in the 405-440 nm or the 385-440 nm violet spectral regions. In contrast, the light spectra of the present disclosure are created using one or more violet LEDs to provide violet light at all wavelengths in the 405 nm-440 nm spectral range (for 400 nm-415 nm dominant peak LEDs) and/or the 390 nm-440 nm spectral range (for 375-390 nm dominant peak LEDs) with at least 20% of the highest violet light radiant power over the respective violet spectral range.

All embodiments of this light source boost the relative spectral radiance of light within the cyan (470-510 nm) portion of the visible light spectrum where the eyes' rods are most sensitive, thereby improving Scotopic or Mesopic visual acuity relative to most other broad spectrum illumination approaches. This relative radiant cyan spectral content is much higher than conventional white LEDs that exhibit a radiance trough in the cyan region. Again, this high cyan radiance is especially useful when the radiant power per unit area of the area to be illuminated will be moderately low, such as in low-power use lighting and large-cone angle lighting situations.

Color recognition or color reproduction is not a leading objective of these new spectra and light source, even though the spectra can be adapted to that purpose. By increasing the light intensity near the extremes of the visible spectrum, variations between different people's eye sensitivities to color will play a larger role in individual interpretation of the color of objects. Using these inverse spectrum light sources, there will be a greater variance in individuals assessing the precise color of many objects for large population groups. However, a greater range of color-reflecting and absorbing types of objects can be perceived by many individuals when using this type spectra and light source, relative to conventional LED lighting, for a given total radiant power from the light source.

This new LED light source apparatus efficiently generates what I have named an "Inverse Spectrum" visible light, using one or more LEDs with dominant peak wavelength light emission within the violet 390 nm-430 nm spectral range, and/or within the blue 430 nm-460 nm spectral range of light.

A single 390 nm violet LED has been uniquely used with the disclosed spectrum converters to efficiently create a full spectrum covering 385 nm-780 nm with over 40% of the peak light radiance at all wavelengths from 385 nm-780 nm. This spectrum-converted violet LED was then further supplemented with a 445 nm blue LED using the same unique color converters. This created a 2-LED light source. The pair of LEDs provided over 50% of the peak light radiance at all wavelengths from 385 nm-780 nm.

Another version of the light source was made using just one 445 nm blue LED with the color converters. This light source provided over 50% of the peak light radiance at all wavelengths from 440 nm-780 nm.

All these light sources also provided a high radiance above 60% of the highest peak radiance at about 495 nm and with over 1.5-times the average light energy between 480 nm and 510 nm relative to the average radiance in the 530 nm-570 nm spectral range.

I determined that the radiance between 530 nm and 570 nm needed to be less than 45% of the highest radiance peak in the spectrum (where the eye cones are on average and collectively most sensitive) and optimally at about 15-35% for most outside terrestrial applications, so as to not distract the eye from the other colors of typical natural objects, and that a high cyan radiance was beneficial in helping assess the texture and surface profiles of many non-reflective darker shade color objects. The spectral balance and radiance can be modified as needed to meet specific objectives, and this new light source concept can be modified to create spectra other than the specific spectra herein disclosed.

Figure 2:
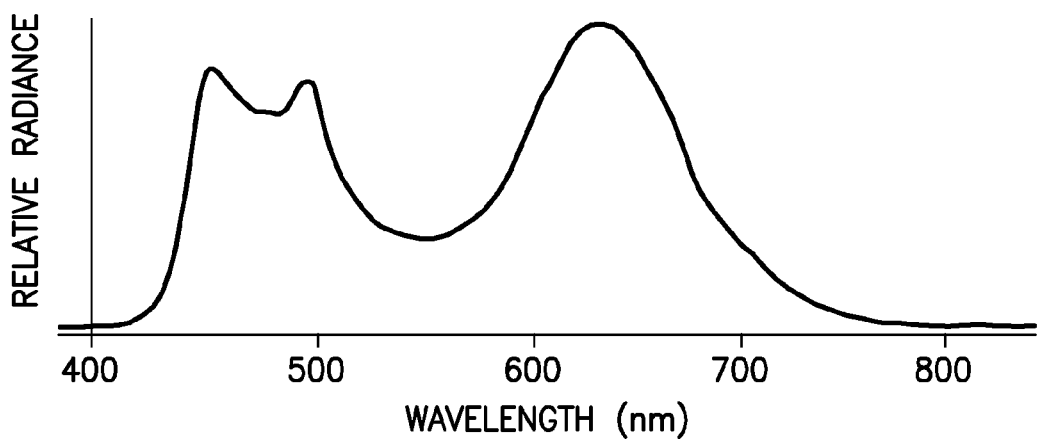
FIG. 2 is a graph of Relative Radiance, as a function of Wavelength, in nanometers, for a spectrum produced by a light emission assembly using one blue LED with one spectrum converter.
Figure 3:
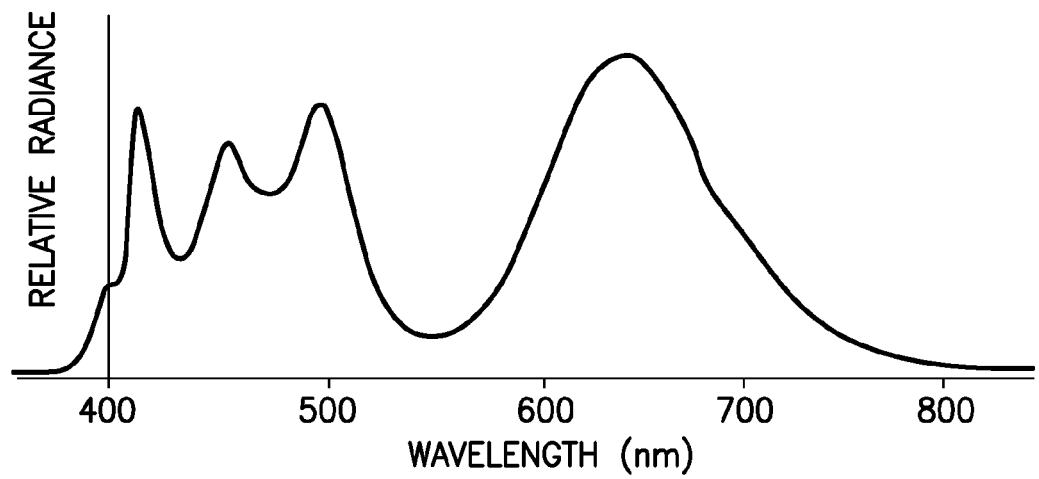
FIG. 3 is a graph of Relative Radiance, as a function of Wavelength, in nanometers, for a spectrum produced by a light emission assembly using blue and Violet LEDs with different spectrum converters.

LEDs and converters arrangements were used to create the examples shown in FIGS. 1-3 having extensive commercial potential and exemplifying the "Inverse Spectrum" concept with the desired radiant troughs in the 530-570 nm spectral range.

Spectrum-shifting concepts are known per se, but the light sources presented herein provide a unique conversion pathway and a select set of LED types and unique wavelength conversions.

All light spectra and light sources in this disclosure share the commonality of a number of specific requirements and characteristics.

The basic spectra disclosed here provide non-naturally-occurring, non-transitory visible light output of a light source comprised of primarily LED elements with spectrum converting materials and/or structures(s), wherein the light source is configured to provide a visible light spectra output comprising 1) a light spectrum, generated by at least one primarily-LED or totally-LED driven light source, and having the following characteristics (A)-(H), and 2) a primarily LED driven source to generate such visible light spectrum:

(A) at least one of (i) radiant light power in the output spectrum over the entire 440 nm-730 nm portion of the visible light spectral range, with radiant power of all individual wavelengths in this range being at least 6% of the highest radiant power peak in such range for light sources not primarily driven by violet radiant light power from LEDs, or (ii) radiant light power over the entire 405 nm-730 nm portion of the visible light spectral range, with radiant power of all wavelengths in this range being at least 6% of the highest radiant power spectral peak in such range for light sources that are primarily or driven by violet radiant light power from LEDs;

(B) two of the three highest radiant power emission spectral peaks are between 630 nm-730 nm, between 390 nm-465 nm, and radiant power of each of these radiant power spectral emission peaks is at least 1.5-times, the highest radiant power of the average radiant power light output within the 530 nm-570 nm spectral range;

(C) the highest radiant power peak within the light spectrum of this light source is at least twice the highest radiant power at any point within the 530 nm-570 nm spectral range;

(D) the average radiant power intensity over the 480 nm-510 nm spectral range is at least 1.5-times, the average radiant power in the 530 nm-570 nm spectral range;

(E) the highest radiant power at any point within the 530 nm-570 nm spectral range is equal to or less than 45%, but also more than 6%, of the highest radiant power peak in the overall emission spectrum of at least one light source;

(F) the radiant power of light at any individual wavelengths in the ultraviolet under 375 nm are less than 6% of the highest radiant power peak in the 400 nm-730 nm portion of the emitted light spectrum of at least one light source.

(G) the radiant power at any individual wavelengths over 820 nm and under 2000 nm must be less than 6% of the highest spectral emission peak in the 405 nm-730 nm portion of the output light spectrum from this light source.

(H) The light spectra that are created when one or more 375 nm-415 nm dominant peak violet LEDs are included and fully ON in this light source must provide violet light at all wavelengths in at least the 405 nm-440 nm spectral range. If this light source is primarily driven using violet radiant light power from one or more violet LEDs, then at least 20% of the highest violet-light radiant power peak radiant power must be present at all violet light wavelengths from this light source between 405 nm-440 nm.

In various embodiments of the light spectrum described above, the four (4) highest radiant power spectral peaks are between 630 nm-730 nm, between 470 nm-510 nm, between 425 nm-465 nm, and/or between 375 nm-425 nm. In other embodiments, the three (3) highest radiant power intensity peaks are between 630 nm-730 nm, between 470 nm-510 nm, and between 425 nm-465 nm. The light spectrum in other implementations may further comprise at least one orange spectral peak in the 580 nm-630 nm spectral range. Still other embodiments of the light spectrum may include at least one additional radiant power spectral peak between 375 nm-405 nm, wherein added deep-violet or UV light provides at least 10% of the highest radiant power intensity peak in the overall 405 nm-730 nm spectral range of the emitted light spectrum of at least one light source.

The disclosure in additional aspects relates to a light source that is configured to generate the light spectra as variously described herein. The light source is susceptible of implementation in a wide variety of embodiments, as discussed in the ensuing description.

In embodiments, the light source may comprise an LED configuration selected from the group consisting of:
(i) configurations of multiple LEDs, wherein each LED in a group of LEDs in the multiple LEDs that is on in a given mode of operation is of a same LED type and emits a same output, and wherein switching modes turn on or off or change luminance of LEDs in at least one group of LEDs in the multiple LEDs; and (ii) configurations of multiple LEDs, wherein different types of LEDs are on at a same time in a given mode of operation.

More generally, the light source may comprise any suitable combination of LEDs or other light source components, and spectrum converters of any of various suitable types, and the light source components and spectrum converters may be provided in subassemblies of the light source, with the light source components and spectrum converters in the respective subassemblies being of a same type or alternatively of different types. LEDs in the light source can use different type LEDs or different spectrum converters as long as the spectrum converters meet all the required criteria herein.

The light source may for example comprise one-or-more violet LEDs that can emit light exhibiting one-or-more dominant emission peaks in the 375 nm-425 nm spectral range in an optical arrangement with one-or-more spectrum converters in the light path from at least one of the LED(s) to the objects to be illuminated.

The light source is suitably configured wherein at least one, but not all, LEDs in the light source(s) require spectrum converters in the light path.

In an illumination mode of operation, one or more of a single type of LED, and one of the same collective type spectrum converters will effectively be turned on at the same time for illumination. Specific spectra of the present disclosure can be generated in various embodiments using just one type LED and color converter "grouping". Switching various LEDs on with or without different spectrum converters can be used to create different or other lighting modes.

In embodiments, the light source may be configured so as to be characterized by at least one characteristic or component selected from the group of characteristics or components consisting of:
a) one or more spectrum converter structures that absorb at least 20% of the emitted light from one or more violet LEDs in the 375 nm-425 nm spectral range and emit light primarily within the 390 nm-520 nm spectral range;
b) one-or-more spectrum converter structures that absorb at least 20% of the emitted light from one or more violet LEDs and emit light exhibiting one or more emission peaks in the 470 nm-530 nm spectral range;
c) one-or-more spectrum converter structures that absorb at least 20% of the emitted light from one or more violet LEDs and emit light exhibiting one or more emission peaks in the 580 nm-730 nm spectral range, with the proviso that if this or these 580 nm-730 nm spectral peak(s) are below 630 nm, then the relative radiance at 640 nm must be at least 45% of the 580-630 nm spectral peak;
d) one-or-more optional spectrum converter structures that absorb light primarily in the 520-580 nm spectral range and emit light primarily in the 580 nm-780 nm range that are used to reduce radiant power in the 530-570 nm spectral range while increasing radiant power in the over-580 nm spectral range and to permit additional shaping of the output light spectrum;
e) spectrum converter(s) comprising at least one of phosphor(s), fluorescent dye(s), quantum dots, and/or other spectrum converting materials or structures in one-or-more translucent medium materials and/or on one or more reflective medium materials;
f) multiple spectrum converters arranged in parallel or in series, or mixed into one or more spectrum converters;
g) spectrum converters of combined, mixed, or multiple types of spectrum converting structures or materials, with concentrations or resulting effect of these spectrum converters comprising groups such that over-30% and less-than 85% of light from one-or-more individual component light sources are collectively absorbed by at least one spectrum converter group in the optical light path of one or more LEDs of the light source;

h) one-or-more spectrum converters are in an optical path of light from LED(s) of the light source to objects to be illuminated;

i) an optical arrangement wherein spectrum converters primarily pass and/or emit light at all wavelengths in the 440-730 nm spectral range, or the 405 nm-730 nm spectral range with at least at 6% of the highest radiant spectral peak provided at all points of the spectrum;

j) average radiant power in the 530-570 nm spectral range will be no less than 6%, but no more than 45%, of the radiant power of the highest peak in the overall light spectrum of the light source;

k) spectrum converters comprising fluorescent or phosphorescent dye(s), phosphor(s), and/or quantum dot(s) in translucent medium materials wherein best-case intrinsic internal quantum yields (QY-i) of primary individual active color converting materials when tested alone under optimal conditions are at least 60%; and l) optical elements selected from the group consisting of photonic crystals, polarizers, gratings, reflectors, lenses, ratings, interference filters, and other filters are comprised in before or after spectrum converters in an optical path of the light source.

A light source may be constituted in some specific embodiments of the disclosure, as comprising:

a) one-or-more blue-violet LEDs exhibiting one-or-more dominant emission peaks in the 425 nm-465 nm spectral range;

b) spectrum converters in the light path of the 425 nm-465 nm dominant emission peak LEDs, wherein the spectrum converters are primarily 425 nm-465 nm absorbing and provide one or more emission peaks in the primarily 470 nm-530 nm and in the 580 nm-730 nm spectral ranges; and c) an optical arrangement wherein collective spectrum converters and LEDs emit light meeting at least one of spectra criteria of (I) the three highest radiant power intensity peaks of the light are between 630 nm-730 nm, between 470 nm-510 nm, and between 425 nm-465 nm, (II) the light comprises at least one orange spectral peak in the 580 nm-630 nm spectral range, and (III) the light comprising at least one radiant power spectral peak between 375 nm-405 nm, wherein added deep-violet or UV light provides at least 10% of the highest radiant power intensity peak in the overall 405 nm-730 nm spectral range of the emitted light spectrum.

In such light sources, the light source may comprise a combination of UV, violet, and/or blue LEDs, arranged to generate a selected spectrum or spectra of the present disclosure.

The light source may be constituted as comprising light source components comprising LEDs, and configured so that the light source components may be switched off or on or varied in intensity by changing power thereto.

In some embodiments, LEDs or other light sources with one or more dominant emission peaks greater than 465 nm may be used in or with other light sources. The output spectra can also be modified by the use of additional or different spectrum converters or optical filters to impart or collectively create the spectra or by mixing LED types and/or color converter types. Other spectra may also optionally be created using a light source of the present disclosure with user selected modes of operation.

The light source in various embodiments may utilize LED spectrum converters as coatings, reflective well-fills, remote layers, and/or shaped spectrum converters with optional lens-like properties utilizing medium materials including PMMA based materials, polycarbonate, PET, PVC, PVA, and polystyrene, dimethyl silicone, phenyl silicone, other translucent silicones, and/or epoxies, and low temperature glass for phosphors, quantum dots and/or fluorescent dyes.

The light source in specific implementations may comprise spectrum converter(s) containing violet and/or blue light absorbing phosphors or quantum dots with a light emission spectrum exhibiting peak light emission in the 475-530 nm or the 580-730 nm spectral range. For example, the spectrum converters may include materials such as LWR6832, LWR6733, LWR6733, RR6535-03, and R6931 sold by Intermatix Corporation CA, USA, 670 nm Phosphor or ZYP640G3, ZYP650G3, or ZYP670G3 from Beijing Nakamura Yuji Science and Technology Co., Ltd. China, ~640 nm peak LNR 640 Oxynitride phosphor available through Hung Ta Trading company in Taiwan, or red and cyan emission phosphors available from Nemoto Lumi-materials Co. LTD in Japan, among others.

The light source in other embodiments may comprise spectrum converter(s) containing violet and/or blue light absorbing phosphors with a light emission spectrum in the 530 nm-570 nm spectral range and YAG phosphor emitting in the 470-510 nm spectral range. The YAG phosphor may be doped or undoped. Other phosphors such as Intermatix GAL520 01 B12, GAL525-01-B12, GAL530-S, GAL530-L or GAL 515 01 B12 green phosphor, ZYP500N from Beijing Yuji, and/or some 540 nm-570 nm YAG phosphors may be advantageously be utilized. Phosphors or other spectrum converting materials emitting primarily in the 530 nm-570 nm spectral range are desirably used in low concentrations or used with spectrum converters that can absorb part of this energy and emit light in the over 580 nm spectral range.

The light source in various embodiments may comprise spectrum converter(s) containing orange phosphor with a light emission spectrum in the 580 nm-630 nm spectral range. Orange phosphors in color converters and other spectrum converters with emission peaks in the 580 nm-630 nm spectral range may be used with one or more of the LEDs or be mixed with over-630 nm emission peak color converter materials. These orange component color converters can be used to widen the red-orange spectral region of the light source and to increase the radiant light power in the 530-570 nm range. UV, violet, and/or blue light absorbing green phosphors in the 475-485 nm spectral range, and/or 570-620 nm yellow-orange or orange-red phosphors may be used to provide incremental cyan light and low intensity light in the green-yellow spectral range.

The light source in specific embodiments may comprise spectrum converter(s) comprising (A) color converter material having an emission peak in the 480-510 nm spectral range, and (B) color converter material having an emission peak in the 580-600 nm spectral range, wherein the weight ratio of (A):(B) is in a range of from 20:1 to 1:10 that produces an emission spectrum including the 530-570 spectral range, and wherein the spectrum converter(s) further optionally include(s) phosphor having an emission spectrum including a range of 630-650 nm.

The use of color converters with emission peaks in the 480-510 nm range such as the Beijing Yuji 490-500 nm phosphors or the 490-500 nm Nemoto Lumi-materials Co. LTD phosphors, mixed with the 580-600 nm phosphor color converters in 20:1 to 1:10 ratios relative to each other, create controllable 530-570 nm radiant light spectra meeting the broad spectral criteria discussed hereinabove. Such arrangements permit tight control of the 530-570 nm spectrum at selected points in the 10-40% of the highest peak range, widen the red-orange spectrum to be more eye-appealing, and provide a high ~495 nm cyan peak right where the rods in the eye are most sensitive. This works using even a single blue LED, and one or more 630-650 nm phosphors can be added to further improve the red spectrum. This arrangement provides a light spectrum having a reduced relative 530-570 nm component, using a high cyan spectral component and a high and wide red spectral component.

In additional embodiments, the light source may be constituted as comprising UV or violet LEDs having an emission spectrum in the 375 nm-420 nm spectral range, and spectrum converter(s) including one or more fluorescent dyes that primarily absorb light in the UV and/or violet spectral range (where over 80% of the radiant power absorption is below 430 nm) and that emit light primarily in the violet, blue and the cyan spectral ranges (over 80% of the emitted radiant power is in the 390 nm-530 nm spectral range). These spectrum converters may be arranged in one or more layer(s) and/or coatings in the light path exiting the LED(s).

Fluorescent dyes may be utilized in the practice of the present disclosure, as distributed in one or more transparent medium layer(s), coating(s), or other structure(s) to create spectrum converters. The medium for the dyes includes translucent materials such as acrylic or polycarbonate in which the selected dyes are reasonably soluble and stable. The dye(s) and medium materials may be coated onto lenses, covers, reflectors, or molded into a near infinite variety of shapes such as lenses or other optical components. These spectrum converters can be arranged in one or more layer(s), coatings, and/or other structures in the light path exiting the LED(s). These fluorescent dyes are distributed in one or more transparent medium layer(s), coating(s), or other structure(s). Phosphors and quantum dots can also be combined with these dyes in these various medium or layered with these dye based spectrum converters.

A light source of such type, with UV-violet LEDs and such dyes can be utilized to provide a full range violet and blue spectrum from only a single type violet LED, and blocks the UV (if any) due to out-of-specification UV LEDs. These dyes in an appropriate medium can be used in the light path of multiple LEDs for increased spectrum control or increased wide-spectrum violet light radiant power.

Suitable dyes include BASF Lumogen F Violet-570 (naphthalimide), BASF Lumogen F Blue-650 (naphthalimide), BASF Uvinul, Tinopal OB™ brightener (2,5-thiophenediylbis(5-tert-butyl-1,3-benzoxazole)), and/or triphenylpyrazoline (TPP). These dyes permit wide spectral range coverage between 405 nm and 500 nm using even just a single LED in the 385-425 nm dominant emission peak range. LED dominant peak is optimal for most applications at 390-410 nm with BASF Lumogen F Violet-570 and/or Tinopal OB™ in polymerized acrylic or polycarbonate at 0.05 to 5 mm thickness and 0.001% to 2.0% concentration range, depending on the percentage of UV or violet light conversion desired and input LED light radiance and spectrum being used.

The light source of the present disclosure may be constituted as comprising any of various suitable spectrum converters that are effective to increase cyan and yellow-green light output from blue and violet input light. Examples of dyes useful for such purpose include BASF Lumogen-F Yellow-83 (perylene), BASF Lumogen-F Yellow 170 (perylene). BASF Orange 240, OR581, OR610, OR 620, BASF Red 300 and Red 305, and/or other perylene-tetracarboxylic derivatives providing similar characteristics shift energy from the blue and green mostly into the orange and red spectral regions.

Useful dyes may include perylene and/or other tetracarboxylic derivative dyes with emission peaks at 630 nm wavelength or longer, including OR650 and OR670 (approximately 650 nm, 670 nm emission peak fluorescent dyes (OR dyes are commercially available from Colorflex GmbH & Co. KG in Germany)) that can be used in a multiple polymer or low temperature glass medium to generate mostly red and deep-red spectrum light from yellow or orange LEDs, or from other violet to orange-red spectral range light sources.

Fluorescent dyes may be mixed with other color converters such as phosphors and QDs, used as layers on color converters or lenses, or used as part of multiple element color converters. Since most of the suitable media for these dyes have index of refraction values over 1.49, low index of refraction coatings and mutilayer coatings along with structured surfaces may be used to improve light output and reduce light trapping in these and other color converters.

Dyes useful in the practice of the present disclosure include naphthalic acid derivatives and related derivatives, such as

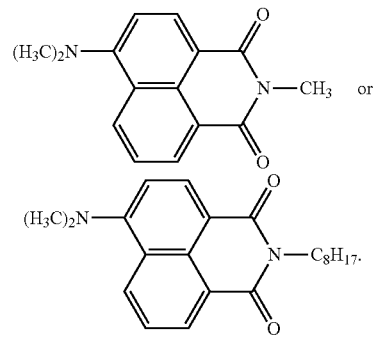

These cyan and green emitting dyes are useful for increasing the light in the 480-530 nm spectral region when excited by violet or blue light.

In other embodiments, the light source may be constituted to comprise at least one of:
(a) a spectrum converter comprising at least one converter selected from the group consisting of photonic crystals, phosphors, dyes, and color-converting quantum structures; and
(b) a non-LED light source component selected from the group consisting of fluorescent, gas discharge, arc, plasma, halogen, incandescent, electroluminescent, cathodoluminescent, laser diode, and OLED light source components.

Photonic materials such as photonic crystals and other color converting quantum structures may be substituted for phosphors and/or dyes, and/or mixed with phosphors or dyes in any of the light sources in embodiments of the present disclosure. Mixtures of different spectral output quantum dots and/or other photonic materials may be used for widening broad spectrum requirements.

The aforementioned non-LED light sources may optionally be used with or without spectrum converters.

The light source may be constituted in various other embodiments as comprising an optical structure providing spectral change with relative position in the light output, with the optical structure comprising a focusing reflector and/or lens that produces center-weighted radiance and a primarily 10-30° cone angle light output from the light source. In such center-weighted radiance lamp, one or more cyan emitting dyes, phosphors, or QD spectrum converters can be provided in a medium placed in the light path of the primary focusing of the light beam, converting part of the remaining blue and/or violet light into cyan spectral range light, e.g., absorbing 20% or more of the remaining blue and/or violet light with one or more emission peaks between 475-530 nm. Such light source may be configured to provide either (1) a 1.5-times or higher relative spectral radiant power of cyan and/or red light in the periphery than the center of the light beam and at-least a 2 times lower intensity at the periphery over 50 degrees from center, or (2) a 1.5-times or higher relative spectral radiant power of cyan and/or red light in the center of the light beam than in the over-50 degree periphery.

This spectrum converter arrangement and optical assembly is effective to provide a widely dispersed cyan light (greater than 50 degree cone angle, or the approximate equivalent dispersion angles in at least one dimension if the light divergence is ellipsoid, rectangular, or another shape). Placing one or more cyan-emitting color converters on or within the reflector (such as a thin layer on the reflector), using dispersive materials as the color converter or with the color converters (such as scattering agents such as $TiO_2$ in the spectrum converters or surface textures), use of dispersive, multi-lens, or microlens arrays as the color converters or with the color converters, use of one or more additional cover glass or lens elements to control the ratio of cyan and primary beam light spectra in the periphery, and the use of separate light sources with the primary beam to provide over 50 degree dispersed high-cyan content light in the periphery, are all contemplated. These arrangements can also include the use of orange or red LEDs with or without dye or QD color converters for the initial 10-30 degree light beam. In this manner, a cyan or other beam can be provided with a narrow center light beam for far-away illumination, as well as for an optimized night-vision Scotopic or Mesopic illumination in the user's periphery.

A series of spectra and light source embodiments and examples are described below.

Each of these spectrum examples was experimentally created using some of the simplest light source LED and spectrum converter configurations.

Spectrum Embodiment 1: In one embodiment of the light spectrum, the three highest radiant power intensity spectral peaks are between 580 nm-730 nm, between 470 nm-530 nm, and between 375 nm-425 nm. Each of these 3 spectral peaks is greater than 1.5-times the average of the radiant power over the 530 nm-570 nm spectral range of this light source.

FIG. 1 provides an example of this light spectrum that is primarily driven by radiant power from one violet LED with two type spectrum converters (1 mixed phosphor-based converter and a separate dye-based converter) providing radiant power spectral peaks at approximately 643 nm, 494 nm, and 410 nm. A spectral radiance trough is between 530 nm-570 nm with a minimum relative radiant intensity of about 17% of the maximum radiance peak at 555 nm.

This illustrative light spectrum appears to most people's eyes as white with a pink tint when the light source is viewed directly. At high light intensities, the light source tends to appear more "white".

Note that this spectrum's radiant power minimum is at the CIE's assessment of the human eye's maximum sensitivity point. This is opposite to the convention of other white light LED spectra.

Spectrum Embodiment 2: In another embodiment of the light spectrum, the three highest radiant power intensity spectral peaks are between 580 nm-730 nm, between 470 nm-510 nm, and between 425 nm-465 nm. Each of these 3 spectral peak points is over 1.5-times the average of the radiant power in the 530 nm-570 nm spectral range of this light source.

The spectrum example in FIG. 2 demonstrates Spectrum Embodiment 2 and was created using one Blue ~447 nm LED with 1 layer of color converter using 3 mixed phosphors on the LED. This illustrative spectrum provides radiant power spectral peaks at approximately 638 nm, 494 nm, and 448 nm. A spectral radiance trough is between 530 nm-570 nm with a minimum relative radiant intensity of about 31% of the maximum radiance peak at 554 nm.

This illustrative light spectrum appears to most people's eyes as white with a magenta tint when the light source is viewed directly. At high the light intensities, the light source tends to also appear more "white".

Note that this spectrum's radiant power minimum is also effectively at the CIE's assessment of the human eye's maximum sensitivity point. Again, this is opposite in concept to the convention of other white light LED spectra.

Spectrum Embodiment 3: In another embodiment of the light spectrum, the four (4) highest relative radiant power intensity spectral peaks are between 630 nm-730 nm, between 470 nm-510 nm, between 425 nm-465 nm, and between 400 nm-425 nm. Each of these 4 spectral peak points is over 1.5-times the average of the radiant power in the 530 nm-570 nm spectral range of this individual light source.

An example of Spectrum Embodiment 3 is provided in FIG. 3. The spectrum of FIG. 3 was created using similar LED light sources to those used to create Spectrum Embodiment 1 and Spectrum Embodiment 2 placed close together at a total combined input power of 3.5 Watts. A slightly lower violet dye-based converter doping level was used with this violet LED.

Spectrum Embodiment 4: A further embodiment of the present disclosure provides a light spectrum comprising at least one radiant power intensity peak between 375 nm-405 nm, wherein the additional violet or ultraviolet light provides radiant power of at least 10% of the highest radiant power peak in the rest of the light source's spectral range of the emitted light spectrum of at least one light. While adding a deep-violet or UV component to a spectrum is not new, this optional feature is useful for enhancing the visibility of UV-activated fluorescent objects. This feature is useful in any of the illustrative spectra provided, with an added ultraviolet (UV) component that can add a peak or broad spectrum UV or deep-violet spectral component.

Variations of Spectrum Embodiment 4: One or more 385 nm-390 nm deep-violet dominant peak LEDs can also be used with spectrum converters to further extend the spectral range to provide a 375 nm-405 nm spectral extension to Spectrum Embodiment 1 for a 375 nm-730 nm covered spectral range. The use of one or more 375 nm-385 nm LEDs can be used to add a UV light violet component or UV peak to the output spectrum, and also still provide over 6% of the peak radiant power at all wavelengths between 405 nm and 730 nm using similar spectrum converters, and meeting the rules required for this new class of spectrum with or without other type LEDs, or uniquely provide such a wide spectrum using just one LED or LED module with one type grouping of spectrum converters.

Average radiant power intensities for each designated range can be also used in place of peak values in each designated spectral range, permitting either peak radiant power values or average radiant power in the range to be used for any of the 1.5-times power relative to the average power in the 530 nm-570 nm spectral range conditions.

A new type light source thus is provided by the present disclosure, which can create all the aforementioned new light spectra meeting all the defined light spectra requirements, and which can be uniquely configured to provide such spectra using just one type of LED and type of spectrum converter collective arrangement (one or more of the same type LED with a given grouping of one or more similar spectrum converters).

Multiple types of LEDs and types of spectrum converters can also be used to create these new spectra, but are now uniquely not necessary. However, one or more LEDs, all using the same spectrum converter arrangement, may be assembled to increase overall radiant power of a given spectrum.

The primary consideration for the potential use of multiple types of LEDs for creating these new spectra is to permit multiple user-controlled spectral modes from a single lamp or grouping of lamps by switching or changing the relative power to various LED and spectrum converter groupings as modes, and/or by changing color converters and/or other optical elements.

In this way a user can select a version of the new spectrum that is preferred for a given situation, such as the spectrum in FIG. 1 or the spectrum in FIG. 2. The lamp user could also use both spectra together to achieve a spectrum that is similar to that shown in FIG. 3.

As another example, an application in which one of the available spectra is similar to FIG. 2 may contain near the minimum 530-570 nm spectral component, such as 6-8% thereof, for better visibility of non-yellow-green reflecting objects in green or yellow grass. The user could also switch on a UV LED or a violet-containing spectrum as in Spectrum Embodiment 1 to better conduct an alternate search for potentially fluorescent items in the grass. Or, the user could switch on a conventional or other higher yellow-green spectral component cool white or warm white LED with any of Spectrum Embodiments 1-3 to better reference the approximate daylight color of objects after identifying the presence and location of such objects being sought. A conventional LED turned on at the same time and balanced with the light sources generating Spectrum Embodiment 3 can create similar-to-sunlight spectral conditions, with the exception of a "potentially" somewhat higher relative cyan spectral component.

These new light sources can be created entirely from commercially available materials that are configured differently than in any other products.

General Light Source Embodiment Discussion and Requirements

At least one, but not all LEDs in the light source(s) require spectrum converters in the light path. LEDs in the light source can use different type LEDs or different spectrum converters as long as the spectrum converters contain the components that are appropriate to meet all required criteria herein. For a given spectral mode of operation, one or more of a single type of LED, and one type of spectrum converter "grouping" arrangement of the same collective type spectrum converters will effectively be turned on at the same time for illumination. Specific spectra of the new spectra embodiments can be uniquely generated by just one type LED and color converter "grouping" using these new light sources. Switching other LEDs on with or without different spectrum converters can be used to create different or other lighting modes and modes.

Figure 4:
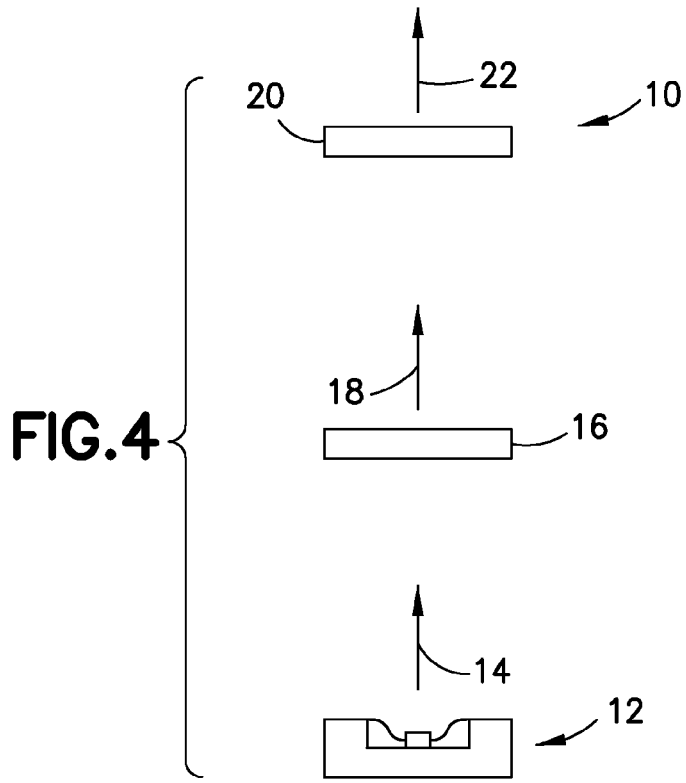
FIG. 4 is a schematic sectional elevation view of a light source assembly according to one embodiment of the present disclosure, comprising one or more LEDs and color converter layers, for producing a spectrum of a type as shown in FIG. 1 or FIG. 3.

FIG. 4 provides a conceptual description of the general light sources discussed herein. One or more spectrum converters are required for these primary light sources, even though other light sources may be coupled into a lamp with these new light sources. The unique selection of spectrum converter absorption and emission spectra are the most important and unique part of these new spectrum converter and LED configurations even though components are commercially available to build the light sources needed to create these new spectra.

The light source assembly 10 schematically illustrated in FIG. 4 comprises one or more LEDs 12 including electrical connections and heat sinks with light reflecting surfaces or reflector or diffuser or other light directing elements providing an LED light output 14. To create the spectrum shown in FIG. 1, a 2.5 W rated ~411 nm dominant peak emission LED was used. A ~449 nm dominant peak emission LED was used to create spectrum shown in FIG. 3. An epoxy dome lens (not shown in FIG. 4) was disposed over the phosphor coated LED in both examples.

The LED light output 14 is impinged on the color converter layer 16. This converter layer converts part of the incoming violet and/or blue light into red and cyan light. Red and/or cyan can be generated using dyes, phosphors, or quantum dots. To create the spectrum of FIG. 1 and FIG. 3, color converter layer 16 was coded on the LED as a cavity-fill structure using a 3:1 ratio of Red 650 nm to 500 nm phosphor at a 6-10% concentration in a phenol silicone medium.

The color converter layer 16 emits a color converter the light 18 that is impinged on the color converter layer 20 in the FIG. 4 light source assembly. The color converter layer 16 converts part of the remaining Violet and/or blue light into broader spectrum violet, blue, and cyan light. This layer can be shaped, and it can alternatively be used as a first color converter layer in place of color converter layer 16 (i.e., with respective color converter layers being reversed in sequence relative to the arrangement shown in FIG. 4 in which color converter layer 16 is the first color converter layer, and color converter layer 20 is the second color converter layer). As a still further alternative, the respective color converter layers can be combined into only one layer if phosphors or quantum dots are added to the medium of this layer. The color converter layer 20 can also provide violet or blue into cyan light color conversion. The color converter layer 20 emits a converted output light 22. To create the spectrum of FIG. 1, color converter layer 20 in one embodiment was a dome shaped structure using a 3:1 ratio of Tinopal OB to Lumogen F Violet-570 at a 0.21% concentration in an acrylic resin.

Figure 5D:
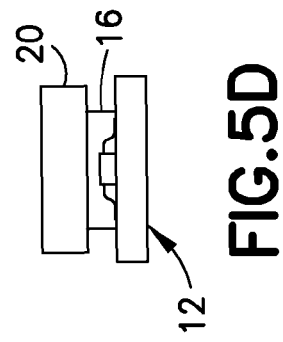
FIGS. 5A-5N is a schematic illustration of various potential configurations of LEDs that may be employed in various light source assemblies of the present disclosure.
Figure 5C:
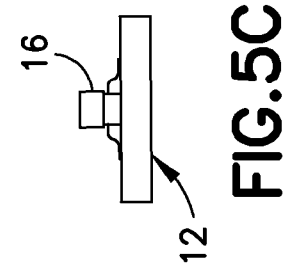
Figure 5B:
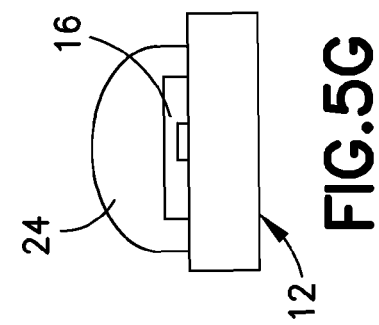
Figure 5A:
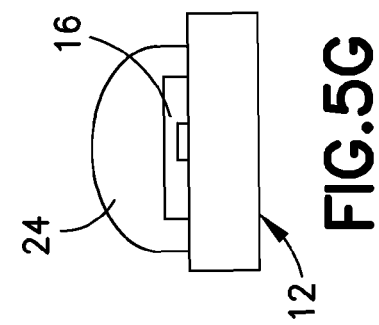
Figure 5H:
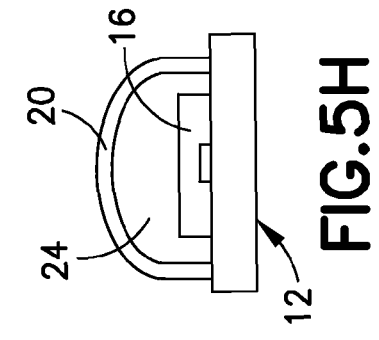
Figure 5G:
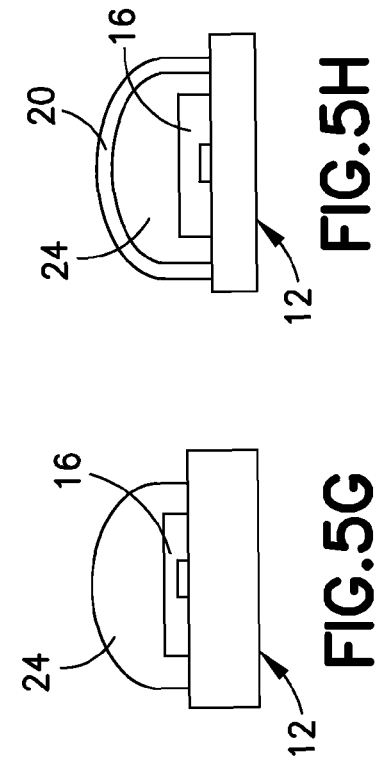
Figure 5F:
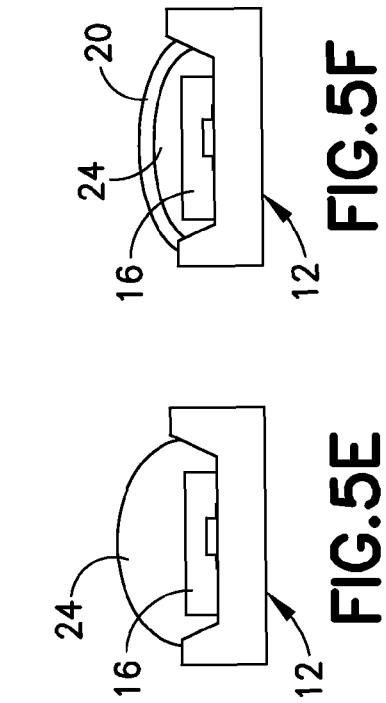
Figure 5E:
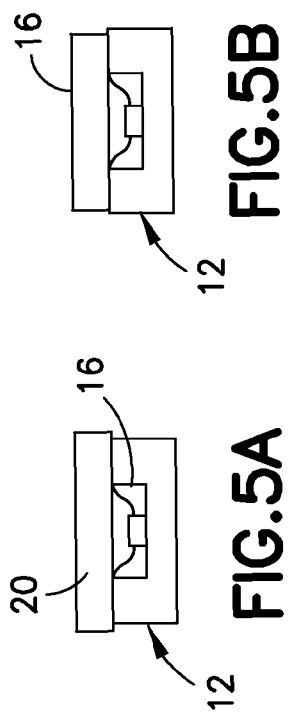
Figure 5I:
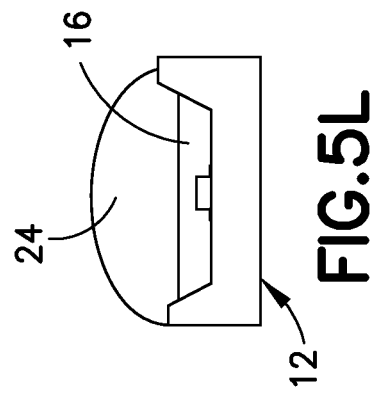
Figure 5J:
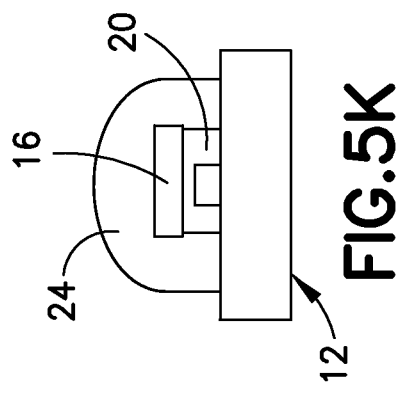
Figure 5K:
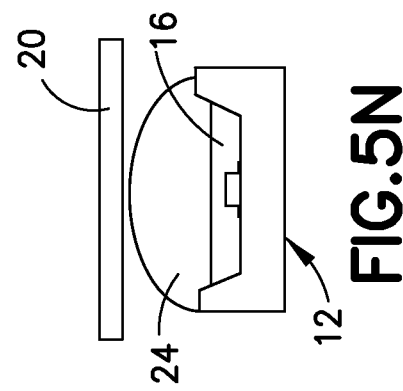
Figure 5L:
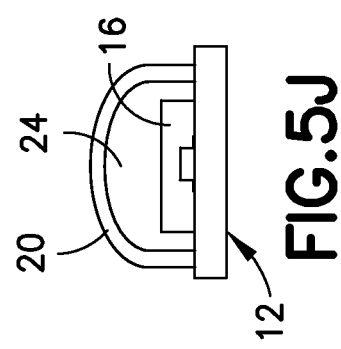
Figure 5M:
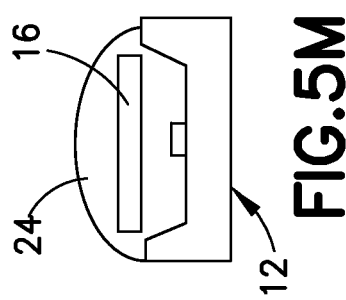
Figure 5N:
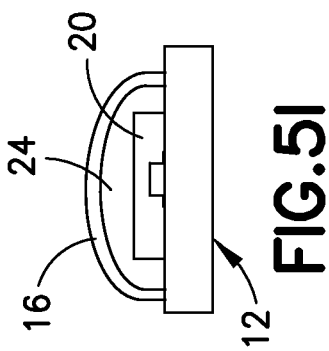

FIGS. 5A-5N show schematic illustrations of various potential configurations of LEDs that may be employed in various light source assemblies of the present disclosure. In FIGS. 5A-5N, the LED structure, first color converter layer, and second color converter layer in the respective light source assemblies are correspondingly numbered with respect to the LED structure 12, first color converter layer 16, and second color converter layer 20 shown in FIG. 4. Optional air or low index or refraction gap filler or lens elements 24 may be employed in the various embodiments. FIGS. 5A-5N show the variant light source assembly arrangements that can be fabricated in accordance with the present disclosure.

The light source assembly structure shown in FIG. 5J shows the basic configuration used for the simple, but effective, experimental demonstration structures used in Light Source Embodiments 1 and 2. In Light Source Embodiment 1, a bottom red color layer (layer 16) comprises a mixed phosphor layer, while a top spectrum converter layer or cover (layer 20) is a cyan emitting dye coating or cap placed over the lens. In Light Source Embodiment 2, a top layer on the lens is not present, or is just an optional light dispersive coating.

Many shapes of lenses and package configurations are known. Additional lenses, filters, light scattering or shaping structures (such as photonic arrays or micro-lenses), and reflectors, may be used with these devices. Reflectors in wells holding the LEDs may be tapered, flat, curved, or other shapes. Most color converter layers or optional lenses or reflectors can be positioned in almost any order between the LED and the subjects to be illuminated as long as reasonable design considerations for a planned objective are made by individuals or teams skilled in the art of LEDs, optics, and phosphor design.

In all cases, multiple LEDs may be packaged together and/or side-by-side to increase the total light output, and/or to mix different portions of a spectrum by mixing LED types and/or types of color converters. Converters can be coated on surfaces, made into lenses, placed on lenses or other structures including an LED, and any of these converter examples can be combined in one layer, or more than two converter layers may be used. Any of these or other LED configurations and LEDs without converters can be used to collectively create the spectra of the present disclosure.

Light Source Embodiment 1:

Light Source Embodiment 1 comprises one or more LEDs that can emit light exhibiting one-or-more dominant emission peaks in the 375 nm-425 nm spectral range in an optical arrangement with one-or-more spectrum converters in the light path from at least one of the LED(s) to the objects to be illuminated. Light Source Embodiment 1 is able to create light spectra meeting the spectral criteria of Spectrum Embodiment 1, and comprises an arrangement wherein:

a) One or more spectrum converters absorb at least 20% of the emitted light from one or more of the violet LEDs in the 375 nm-425 nm spectral range and emit light primarily within the 390 nm-520 nm spectral range.

b) One-or-more spectrum converters absorb at least 20% of the emitted light from one or more of the violet or LEDs and emit light exhibiting one or more emission peaks in the 470 nm-530 nm spectral range.

c) One-or-more spectrum converters absorb at least 20% of the emitted light from one or more of the violet LEDs and emit light exhibiting one or more emission peaks in the 580 nm-730 nm spectral range, with the proviso that if this or these 580 nm-730 nm spectral peak(s) are below 630 nm, then the relative radiance at 640 nm must be at least 45% of the 580-630 nm spectral peak.

d) One-or-more optional spectrum converters that absorb light primarily in the 520-580 nm spectral range and emit light primarily in the 580 nm-780 nm range that are used to reduce radiant power in the 530-570 nm spectral range while increasing radiant power in the over-580 nm spectral range and to permit additional shaping of the output light spectrum.

e) The spectrum converters may consist of phosphor(s), fluorescent dye(s), quantum dots, and/or other spectrum converting materials or structures in one-or-more translucent medium materials and/or on one or more reflective medium materials.

f) Multiple spectrum converters may be arranged in parallel or in series, or mixed into one or more spectrum converters to provide the spectra provided in one or more of the new spectrum embodiments.

g) These spectrum converters may be combined, mixed, use multiple types of spectrum converting structures or materials, and the concentrations or resulting effect of these selected spectrum converting components as a "grouping" are such that over-30% and less-than 85% of the light from one-or-more of the individual component light sources are collectively absorbed by the spectrum converter component(s) in the optical light path of one or more LEDs.

h) One-or-more of the designated spectrum converters are in the optical path of light from the LED(s) to the objects to be illuminated.

i) An optical arrangement is employed in which the collective spectrum converters are designed to pass or emit light at all wavelengths in the 440-730 nm spectral range or the 405 nm-730 nm spectral range with at least at 6% of the highest radiant spectral peak provided at all points of the spectrum provided in one or more of the new spectrum embodiments.

j) The average radiant power in the 530-570 nm spectral range will be no less than 6%, but no more than 45% of the radiant power of the highest peak in the overall light spectrum.

k) The spectrum converters are configured such that the fluorescent or phosphorescent dye(s), phosphor(s), and quantum dot(s) in translucent medium materials are selected such that the best-case intrinsic internal quantum yields (QY-i) of the primary individual active color converting materials when tested alone under optimal conditions are at least 60%.

l) Other optical elements such as photonic crystals, polarizers, reflectors, lenses, ratings, interference filters, and other filters may be used in the before or after spectrum converters in the optical path to achieve certain various objectives.

FIG. 1 is a graph of Relative Radiance, as a function of Wavelength, in nanometers, for a spectrum produced by a light emission assembly using one violet LED with two spectrum converters.

The FIG. 1 example of Spectrum Embodiment 1 was created using Light Source Embodiment 1 with a single 1.8 Watt (500 mA) biased ~410 nm dominant emission peak LED and 2 types of spectrum converters in the light path from the violet LED. The first spectrum converter layer in this example was a 1:4:3 mix of ~620 nm and ~650 nm emission peak nitride phosphors and a 495 nm emission peak cyan emission color phosphor placed directly over the LED in a silicone matrix. A half-sphere clear epoxy lens was placed over the LED. The half-sphere epoxy lens was then coated at approximately 0.2-0.3 mm thickness with a mixture of 0.08% Tinopal OB and 0.08% Lumogen F 570 in an acrylic medium, then overcoated with a ~0.2-0.3 mm thickness spray of acrylic sealant for electronics containing about 2-5% by weight 200 micron (0.2 mm) nominal size dispersive $TiO_2$ particles. A ~2 mm thickness range, flat, translucent polycarbonate plate dyed with 0.02% Tinopal OB and 0.01% Violet 570 and that consisted array of micro-lenses on the plate surface was also used in separate configurations, providing a 60-90 degree beam spread.

Light Source Embodiment 2 comprises a light source as provided in Light Source Embodiment 1, except that this light source uses only one or more 425 nm-465 nm dominant emission peak LEDs to meet the spectral criteria of Spectrum Embodiment 2 and comprises the following components and characteristics:

a) one-or-more LEDs exhibiting blue-violet LEDs exhibiting one-or-more dominant emission peaks in the 425 nm-465 nm spectral range.

b) the spectrum converters in the light path of the 425 nm-465 nm dominant emission peak LEDs being utilized in the same manner as the 375 nm-425 nm dominant emission peak LEDs in Light Source Embodiment 1, except that these spectrum converters are primarily 425 nm-465 nm absorbing and provide one or more emission peaks in the primarily 470 nm-530 nm and in the 580 nm-730 nm spectral ranges.

c) an optical arrangement where the collective spectrum converters and the LEDs are designed to emit light meeting the spectra criteria of Spectrum Embodiment 2.

FIG. 2 is a graph of Relative Radiance, as a function of Wavelength, in nanometers, for a spectrum produced by a light emission assembly using one blue LED with one spectrum converter.

The FIG. 2 example of Spectrum Embodiment 2 was created using example Light Source Embodiment 2 with a single ~2.5 Watt (700 mA) biased Blue 447 nm LED with 1 layers of 3-phosphor color converter. The first spectrum converter layer was a 1:4:2 mix of ~620 nm and ~650 nm GaN Red phosphors and 495 nm peak emission cyan phosphor in a silicone matrix coating containing about 2% by weight, 100 micron nominal size $TiO_2$ particles. A round half-sphere epoxy lens was placed directly over the LED, and then coated with a ~0.2-0.3 mm thickness spray of acrylic sealant for electronics containing about 2-5% by weight 200 micron (0.2 mm) nominal size dispersive $TiO_2$ particles.

FIG. 3 is a graph of Relative Radiance, as a function of Wavelength, in nanometers, for a spectrum produced by a light emission assembly using blue and violet LEDs with different spectrum converters.

Light Source Embodiment 3: A light source as provided for in Light Source Embodiment 1 and/or 2 except that this light source can also contain a mixture of UV, violet, and/or blue LEDs to generate the selected spectra of the new spectra embodiments. The LEDs and associated spectrum converters that are on in each mode of operation used to generate the spectra of the new spectra embodiments must meet the other criteria of Light Source Embodiment 1, and may comprise:

a) one-or-more LEDs exhibiting blue-violet LEDs exhibiting one-or-more dominant emission peaks in the 425 nm-465 nm spectral range.

b) the spectrum converters in the light path of the 425 nm-465 nm dominant emission peak LEDs being utilized identically to the 375 nm-425 nm dominant emission peak LEDs in Light Source Embodiment 1, except that the spectrum converters that are primarily utilized to be 375 nm-425 nm absorbing and 400 nm-520 nm emitting are not used unless 375-425 nm dominant emission peak LEDs are included in the light source.

c) an optical arrangement where the collective spectrum converters and the LEDs are designed to emit light meeting the spectra criteria of the new spectra embodiments.

The spectrum of FIG. 3 was created using the combined type light sources of Light Source Embodiment 1 and Light Source Embodiment 2 together at a total balanced power of 4 Watts input LED power. The Light Source Embodiment 1 LED was the same as in FIG. 1, but the dye concentration used in the spectrum converter lens coating was about 50% lower than in the color converter used to create the spectrum in FIG. 1. This example shows that the violet part of the spectrum can be modified over a wide range as desired, based on the dye concentration, type dyes, converter location and design, and thickness of the dye layer used.

FIG. 4 is a schematic sectional elevation view of a light source assembly, according to one embodiment of the present disclosure, comprising one or more LEDs and color converter layers, for producing a spectrum of a type as shown in FIG. 1 or FIG. 3.

Light Source Embodiment 3: A light source is provided for in any of Light Source Embodiments 1, 2, and/or 3, where one or more variations of Light Source Embodiments 1, 2 and/or 3, and other type light source(s) can be used together. Any of the Light Source Embodiment for 2 LEDs or other light source components in this overall light source may be switched off or on, or varied in relative intensity by changing power to individual or groupings of light source components. Additionally, LEDs or other light sources with one or more dominant emission peaks greater than 465 nm may be used in or with the light sources of Light Source Embodiments 1, 2 and/or 3. The output spectra can also be modified by the use of additional or different spectrum converters or optical filters to impart or collectively create the spectra in the new light spectrum embodiments or by mixing LED types and/or various color converter types as desired. Other spectra not covered by Light Spectrum Embodiments 1-3 may also optionally be created using this light source with user selected modes of operation.

Any of the color converter layers can be reversed, combined, separated into additional layers, and/or built into, onto, or coupled with other optical structures and materials. The color converter layers may have non-photoactive layers or space between the layers, or lens element(s) may be placed in or between the layers depending on the optical design objectives.

The light source of the disclosure may be constituted with multiple emission spectrum spectrum converters arranged as a 2-D or 3-D array of discrete color-converter elements for each LED or group of LEDs, wherein the discrete color-converter elements have been formed by patterning and arranged in one or more groupings for generation of the output spectrum. The color converters may be patterned by lithography, indention or molding, formation of substrate wells and filling thereof, inkjet techniques, 3-D printing, or any other suitable patterning methods. The many discrete color elements may be arranged in one or more grouping(s) to create the different output spectra. Lenses or other optical elements may be patterned under, over, or into each of these color-converter elements or groups of color-converter elements.

As a result of the new class of light source devices of the present disclosure, it is no longer necessary to use more than one type of LED and color converter grouping in a light source to obtain full-spectrum, efficient lighting ranging from the UV well into the near-infrared.

Switching between different LEDs and other light source elements, or changing relative power between alternate arrangements of LEDs and other light source elements, with the same or different spectrum converters in a lamp, can also be used to effectively create multiple light sources with different output spectra from a given lamp, or from grouping of lamps.

Color converter or filter changes can be implemented to permit users to select light source spectral and radiance modes optimized for specific purposes.

For example, a basic single 2.5 Watt input LED light spectrum of a type as shown in FIG. 3 with very low 6-15% green—yellow light may be used to highlight objects or materials that are most visible using reds, cyans, and blues in one mode. Then a second 2.5 Watt input LED may be switched on that uses a 390 nm dominant peak violet LED with the spectrum widening violet-blue spectrum converter disclosed herein to add a high violet peak to the spectrum. These 2 LEDs could also be modulated or adjusted in relative power to each other, have color converters or filters changed, or be used with additional LED types to create other variations of the spectra and other light spectra at various overall radiant intensities.

Various types of optical elements can also be used to modify the beam spread or to change the spectral distribution across a distant area.

A unique optical structure providing spectral change with relative position in the light beam can be used to create a center-weighted radiance lamp with high red light content such as a Magenta LED (blue and/or or violet dominant peak LED(s) with a high-concentration 580-680 nm emission peak phosphor or red-emitting QD grouping designed to absorb over 40% of the blue and/or violet LED light) with a focusing reflector and or lens, to provide a primarily 10-30 degree cone angle light beam.

One or more cyan emitting dyes, phosphors, or QD spectrum converters in a medium can be placed in the light path of the primary focusing of the light beam, converting part of the remaining blue and/or violet light into cyan spectral range light, absorbing 20% or more of the remaining blue and/or violet light with one or more emission peaks between 475-530 nm.

This spectrum converter arrangement and optical assembly can be utilized to provide a widely dispersed cyan light (over 50 degree cone angle, or the approximate equivalent angles if the light divergence is ellipsoid, rectangular, or another shape).

Variations of this optical structure include the placement of one or more cyan emitting color converters on or within the reflector (such as a thin layer on the reflector), using dispersive materials as the color converter or with the color converters (such as scattering agents such as $TiO_2$ in the spectrum converters or surface textures), use of dispersive, multi-lens, or micro-lens arrays as the color converters or with the color converters, use of one or more additional translucent covers or one or more lens to control the ratio of cyan and primary beam light spectra in the periphery, and the use of separate light sources with the primary beam to provide over 50 degree dispersed high-cyan content light in the periphery. This includes the use of orange or red LEDs with or without dye or QD color converters for the primary beam.

Close to the light source, the spectrum produced by the above optical structure would appear similar to the spectra in FIG. 1, 2, or 3. The relative cyan light content in the primary light beam spectrum would diminish with distance, unless the primary light beam provided a spectrum similar to FIG. 1, 2, or 3, and the cyan were generated by a separate source in or near the lamp with wide angle dispersion.

The resulting advantage of this light source and optical arrangement is that a much lower radiant intensity per steradian of "high-cyan-content light" can be used to illuminate a large peripheral area in the vicinity of the actual or virtual location of the light source user, while the primary 10-30 degree light beam with much higher radiant light power per steradian can be used for distance viewing with lower risk of potentially losing mesopic vision, provided reasonable care is taken in designing the system to avoid direct paths of light from the light source to the eye, and care is taken to avoid shining the primary beam too close to the observer or onto excessively light reflecting objects.

Enhancements to lamp optical systems and lamp LED and/or color converter components for reproducibility, performance, exiting light angle distribution, special features, and light extraction efficiency from LEDs and spectrum converters include many known techniques including surface coatings of graduated index of refraction, reflectors and reflector arrays, embedded light scattering or light redirection structures, photonic crystals, oriented or random nanoparticles and/or microstructures or nanostructures, fiber or oriented crystal arrays, surface structures such as matte finishes, micro lenses, gratings, or light scattering particles, interference filters and/or absorbing filters. These features can improve light output, color, spectral peaks, spectral range, light emission angle, and polarization, and can modify other optical characteristics from the LEDs and color converters, as specific design objectives may dictate.

The disclosure also contemplates using a primarily 10-30 degree range focused light beam from these light sources with a removable or adjustable focus or beam spreading adjustment capable of diverging the beam into wider angles up to 60°, 90°, or even 180°, as further system embodiments of this type light source.

One of the preferred optical embodiments of a lamp includes the use of a fine matte finish (e.g., 10-50 micron) or a light scattering particle-containing surface coating, to scatter part of the light from the lens, and built onto the LED after at least one of the color converters. LED lens and/or reflector arrangements may be employed to direct over 50% of the light forward in a 15-35 degree cone angle, but intentionally dispersing at least 30% of the light in a wide over-50 degree angle (in at least one direction). Slight off-focus positioning of the LED may be optimal if one or more shaped reflectors or secondary focusing lenses is used. This configuration should not include any significantly visible sharp edge patterns or abrupt angular changes in radiance such as rings, bright spots, or dark spots at a 3 meter distance from the light source. The center and/or peripheral light beam divergence may provide a round, oval, rectangular or any other shape beam. The center and peripheral light beams divergence need not be of a same shape.

An illustrative lamp can be fabricated using these light sources and using a non-linear multi-directional graduated radiance optical arrangement to constitute a light source configured to provide relatively uniform radiant illumination over a large surface area out in front of the user when the light source is at an angle to the surface to be illuminated, and providing lower intensity graduated illumination to the periphery of the primary light beam. Such a lamp could be configured as a head-mounted light for hiking that would uniformly illuminate an assumed flat area out in front of the lamp wearer, assuming an effective 30 degree cone angle primary light beam and a 70 degree cone angle peripheral beam, a nominal estimated 175 cm high beam origin from the ground plane, and a 20 degree center ray angle from an assumed flat ground plane relative to the user and light source. This places the nominal center of the illuminated area at about 4.8 meters from the subject. By choosing the reflector shape, lens shape, reflector coating non-uniformity, non-uniform light scattering coatings, color-converter non-uniformity, and/or cover glass or lens shape, one skilled in the art of optical design for illumination can create a light profile (manually or using available optical design software) that will provide a gradual taper of output radiant power from the primary spot center so that the radiant power can be reasonably uniform across the primary and/or the peripheral illuminated surfaces.

While this illustrative design is somewhat simplified because ground surface profiles and user heights do vary, reasonable normalized correction factors can be determined and used to design illuminators using this concept, to greatly improve portable lighting for these and other applications using the techniques provided herein. Further, optical elements and lighting arrangements can be made adjustable so that users can select correction factors based on their stature and/or the environment. This concept applies to many types of illumination applications including fixed position lights, flashlights, leg-mounted lights, and others.

An illustrative extension of this concept involves the use of one or more non-symmetric and graduated dispersive lamp covers or lens, mini-lens or micro-lens arrays, and/or non-symmetric optical reflectors that are optionally rotatable, exchangeable, or removable. Spectrum converters and/or separate light source components in the overall light source can be used as part of, and/or with such non-symmetric optical configurations to generate all or only part of the spectrum of the lamps, enabling the lamps' radiant power to be more focused, dispersed, or non-uniformly distributed, as desired.

Illustrative phosphor materials include a 640 nm to 670 nm dominant peak emission GaN phosphors such as LWR6832, LWR6733, LWR6733, RR6535-03, and R6931 sold by Intermatix Corporation, as well as 650 nm-670 nm dominant peak emission GaN Phosphor or ZYP640G3, ZYP650G3, or ZYP670G3 from Beijing Nakamura Yuji Science and Technology Co., Ltd, or 640-680 nm dominant peak emitting Quantum dots. The phosphors or QDs are placed in a silicone medium or other translucent medium and placed over the LED as a coating, remote layer, mirror coating, and/or part of a lens-like assembly depending on the designed exciting light angles and desired exit light angles. A 0.02-10.0 mm thickness translucent medium coating, 2-15 weight-% concentration of 650 nm GaN phosphor coating is an example.

In Embodiment LS 2.0, mixtures of phosphors, dyes, and/or QDs are used in at least one of the layers of Embodiment LS 1.0. A small amount of green, yellow, and/or orange-red emitting dye is mixed with the >640 nm emitting dye, QD, or phosphor to "fill in" the spectrum and/or to add greater cyan light radiance into the spectrum. Fill-in refers to providing some light energy at the wavelengths between the peaks in the emission spectrum. Phosphors such as Intermatix GAL520 01 B12 green phosphor and 540 nm-570 nm, Beijing Yuji 490-500 nm range phosphors, and/or various YAG related, or other green-to-yellow phosphors from many suppliers and/or 570-620 nm yellow-orange or orange-red phosphors can be employed to provide low intensity light in the green-yellow spectral range. Yellow, orange, and red oxynitride phosphors such as the 640 nm dominant peak emission (LNR 640 sold by Hung TA Phosphors, http://hung-ta-co.com/eng/contact.aspx, Taiwan) and phosphors by Nemoto Lumi-materials Co. LTD in Japan can also be used for supplementing the yellow-orange spectrum or to provide red light to the spectrum. In such embodiments, the average 530-570 nm green to yellow light radiant power is kept within the unique peak and/or average intensity limits of the 6%-45% spectrum radiance criteria.

Mixtures of commercially available orange and red phosphors can be used to provide a wide red spectrum. For example, a mixture of dominant emission 590 nm, 620 nm, and 650 nm phosphors, QDs, and/or dyes can be used in any of the embodiments to broaden and shape the red spectrum to a purpose. The same technique can be used to provide a wider or shaped violet, blue, or cyan light spectrum or to supplement a portion of the 530-570 nm spectral region. Likewise, dyes and QDs may be used to extract light radiance from a portion of the spectrum. An example of reducing light in a spectral region would be using BASF Red 305 to reduce light in the green spectral region and then reemit most of this energy in the orange and red spectral region.

In embodiments, a violet absorbing and violet-to-blue emitting dye or phosphor is placed in one or more layers and/or coatings in the light path exiting the LED(s). Fluorescent dyes in a transparent matrix (such as acrylic or polycarbonate) are used. Example dyes include BASF Lumogen F Violet-570 (naphthalimide), BASF Lumogen F Blue-650 (naphthalimide), BASF Uvinul, Tinopal OB brightener (2,5-thiophenediylbis(5-tert-butyl-1,3-benzoxazole)), and/or triphenylpyrazoline (TPP). A 0.001%-3.0% range of dye concentration and 0.01 mm-10 mm thickness is viable.

A mixture of 0.005-0.200% BASF Lumogen F Violet-570 (naphthalimide) and 0.010%-0.9% Tinopal OB brightener (2,5-thiophenediylbis(5-tert-butyl-1,3-benzoxazole)) in an example medium of acrylic or polycarbonate can be used in illustrative embodiments of the disclosure.

400 nm-415 nm LEDs can be used to produce a good 390 nm-510 nm range emission spectrum with a small increased emission in the 480 nm-500 nm cyan region. These same example violet and blue emitting dyes can also be used mixed or independently in a suitable medium with good results at spreading a 390 nm-420 nm violet LED emission over a wide violet and blue spectral range. The specific selection is based on the fine detail of spectrum design within this class of spectra.

A more specific viable working example dye layer is 0.04% Lumogen F Violet 570 in a 0.4 mm thickness polycarbonate film. A 0.08-0.20% concentration BASF Uvinul, Tinopal OB brightener film of 0.4 mm thickness is another viable example. These films can be lays, formed as lenses, used as molded or flat lens covers, or placed elsewhere in the exiting light beam pathway.

Mixtures or multiple layers of different dyes may also be used to fill in portions of the spectrum as previously discussed. An example is BASF Lumogen F Yellow 83 or other Yellow that emits light in the cyan and green portion of the visible light spectrum. A Violet-Blue emitting dye such as Lumogen F Violet 570 can be mixed with Lumogen F Yellow 83 to add both cyan and green light into the spectrum. Lumogen F Orange 240 and/or Lumogen F Red 300 or 305 may also be added as needed to increase or decrease other spectral components.

A difference from the prior art is that none of the prior art uses the violet or blue fluorescent dyes or equivalent spectrum mixtures of QDs that are required in the present disclosure. One or more dyes and one or more phosphors can be mixed or layered. Dye or phosphor layer coatings or reflectors are also contemplated.

Utilizing these light sources mounted on each of the legs and on the head and/or upper body provides a method for providing a range of angles of incident light to the illuminated surfaces that can enhance the user's ability to visually discern low contrast surface irregularities. Use of a flashlight and/or fixed position lights made from these new light sources allows additional user freedom of directing the light where needed and to further increase the incident light angles for improved vision.

Angles of light from the light source and from objects relative to the observer also play a significant role in the perception of objects, colors, contrast, and shapes or contours. There is no perfect angular illumination from one or a small number of light source locations relative to the subject and observer for all situations. Two important light beam shape embodiments are contemplated by the present disclosure for situations in which one or more light sources are in close proximity to the observer. These embodiments include (1) a smoothly graduated, center weighted light beam with over 50% of the radiant light power in the center 15-30 degree primary cone angle from the light source(s), and almost all of the remaining radiant light power smoothly distributed over a 60 degree angle (up to and over 180 degree cone angles from the light source are practical, depending on lens, filter, and/or spectrum converter placement, and this graduated focusing arrangement on flashlights and head mounted lights allows for color and/or object perception up close to and even beside and behind the user with lower intensity light allowing moderate dark adaptation to be retained, and the higher intensity light with the substantial cyan component to permit long distance night vision), and/or (2) wide-angle 60-120 degree primary light cone angle body mounted lights placed closer to the ground (e.g., at the waist or on the legs) that are used for enhanced imaging at shallow angles where a person is walking and about to walk. Proper placement of one head-mounted and two leg-mounted lights can be used to allow a user to look ahead and still see near-obstacles for more secure footing. The cone angle of the light source light spectrum, and light intensity, can be selected to permit the user to remain in the mesopic vision mode making best use of the eye's rods and cones while using minimal power for lighting, with virtual amplified vision in the longer and shorter wavelength ranges to provide better detection of a very wide range of color objects.

Figure 6:
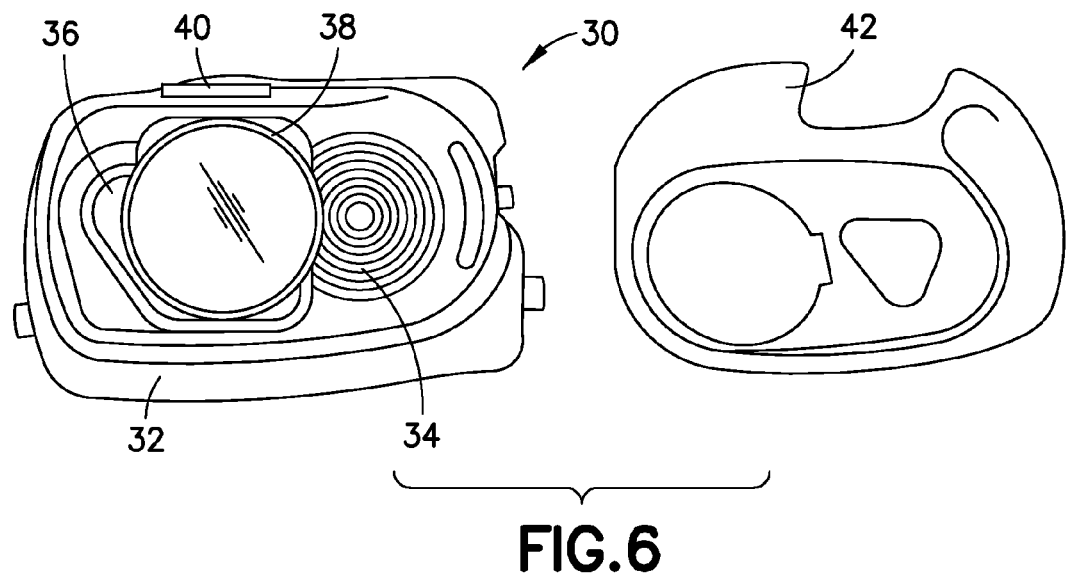
FIG. 6 shows a light source assembly according to one embodiment of the present disclosure, comprising a multiple spectral mode lamp including one 3 Watt LED and three 0.10-0.20 Watt LEDs, with a sliding multi-lens beam widener.
Figure 7:
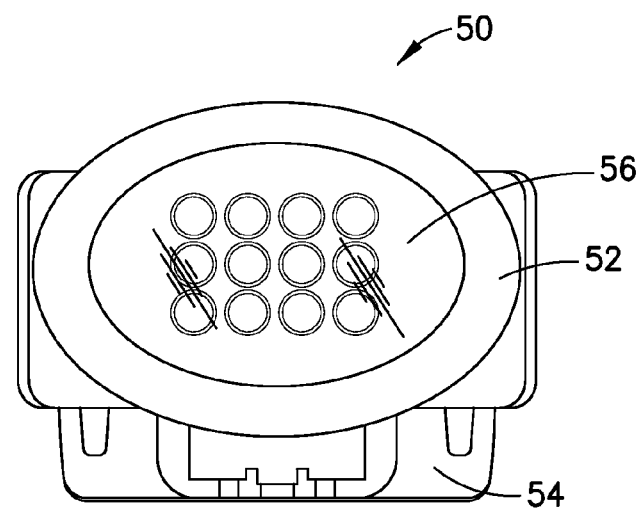
FIG. 7 shows a light source assembly according to another embodiment of the present disclosure, comprising a multiple spectral mode lamp including twelve 0.10-0.20 Watt 5 mm DIP LEDs.

Two example light source system implementations of these light sources are shown in FIGS. 6 and 7. Both of these examples contain batteries and switches that can control which LEDs are on at the same time.

FIG. 6 shows a light source assembly 30 according to one embodiment of the present disclosure, comprising a multiple spectral mode lamp including one 3 Watt LED and three 0.10-0.20 Watt LEDs with a sliding multi-lens beam widener. The light source assembly comprises a housing 32, which may comprise a plastic casing with a battery housing in a rear portion thereof. A plastic cover 42 is provided to hold the sliding lens 38 in place.

The FIG. 6 lamp is capable of providing all spectra shown in FIGS. 1-3. The left cavity 36 under the slidable lens array 38 contains two 5 mm violet 405 nm dominant peak round-top LEDs with 20-30° epoxy lenses that are coated with 0.12% wt. concentration of BASF V570 and/or Tinopal OB brightener in a nominal 0.3 mm thick acrylic coating. This cavity also contains one 440-450 nm blue LED with a mixture of 495 nm and 590 nm phosphors adjusted so the blue, cyan, and orange peaks are of similar radiance (mixed cyan and orange phosphors). The lenses formed around the LEDs are round top 20-30° epoxy lenses, but other lenses, including spectrum shifting lenses, may be used.

The right side of the FIG. 6 lamp contains one 3 W capable LED biased to operate at about 2.5 Watts, but this LED can be biased differently. This example LED is placed under an undyed acrylic lens 34 to provide a 20-30 degree primary light beam.

The 3 W capable LED is a blue 445-450 nm LED with a mixture of 495 nm, 620-630 nm, and 640-650 nm phosphors (mixed cyan phosphor and two red phosphors).

The control button 40 changes which LEDs are on in each mode. Each push of the control button changes the spectral mode that is on, or turns off the device.

When just the 3 small LEDs are on together at the correct intensities, a spectrum is created comprising at least one orange spectral peak in the 580 nm-630 nm spectral range. If a dominant spectral peak is provided between 580 nm-630 nm, a spectral peak in the 630 nm-730 nm spectral range can be optionally omitted, but the spectral radiance at 640 nm must be at least 45% of the spectral peak within the 580-630 nm spectral range. Furthermore, if one of the highest 3 radiant spectral peaks is provided between 580 nm-630 nm, a radiant peak in the spectral region between 470 nm-530 nm that is 1.5-times the average light radiant power over in the 530-570 nm spectral region must be provided, or the average radiant power in the 480-505 nm spectral region must be over 1.5-times the average of the radiant power in the spectral region between 470 nm-530 nm.

When only the large LED is on, a spectrum like that shown in FIG. 3 is created. More generally, a spectrum is created in which the three (3) highest radiant power intensity peaks are between 630 nm-730 nm, between 470 nm-510 nm, and between 425 nm-465 nm.

When all the LEDs are on together, a spectrum is created over most of the 20-30 degree illuminated area at over 2 meters distance. This spectrum is similar to that shown in FIG. 1, but provides a lower relative violet radiance than the spectrum shown. The spectrum generated when all LEDs are on together advantageously has the following characteristics:

(A) at least one of (i) radiant light power in the output spectrum covering the entire 440 nm-730 nm portion of the visible light spectral range, with radiant power of all individual wavelengths in this range being at least 6% of the highest radiant power peak in such range for light sources not primarily driven by violet spectral range radiant light power from LEDs, or (ii) radiant light power over the entire 405 nm-730 nm portion of the visible light spectral range, with radiant power of all wavelengths in this range being at least 6% of the highest radiant power spectral peak in such range for light sources that are primarily or driven by violet spectral range radiant light power from LEDs;

(B) two of the three highest radiant power emission spectral peaks are between 630 nm-730 nm and/or between 385 nm-465 nm, and radiant power of each of these radiant power spectral emission peaks is at least 1.5-times, the highest radiant power or the average radiant power light output within the 530 nm-570 nm spectral range;

(C) the highest radiant power peak within the light spectrum of this light source is at least twice the highest radiant power at any point within the 530 nm-570 nm spectral range;

(D) the average radiant power intensity over the 480 nm-510 nm spectral range is at least 1.5-times, the average radiant power in the 530 nm-570 nm spectral range;

(E) the highest radiant power at any point within the 530 nm-570 nm spectral range is equal to or less than 45%, but also more than 6%, of the highest radiant power peak in the overall emission spectrum of at least one light source;

(F) the radiant light power at any individual wavelengths in the ultraviolet under 375 nm are less than 6% of the highest radiant power peak in the 400 nm-730 nm portion of the emitted light spectrum;

(G) the radiant power at any individual wavelengths over 820 nm and under 1500 nm must be less than 6% of the highest spectral emission peak in the 405 nm-730 nm portion of the output light spectrum; and (H) the light spectra that are created when one or more 375 nm-415 nm dominant peak violet LEDs are included and when ON in this light source must provide violet light at all wavelengths in at least the 405 nm-440 nm spectral range using a spectrum converter with no more than 2 different dominant peak emission types of violet LEDs, and if this light source is primarily driven using violet radiant light power from one or more violet LEDs, then at least 15% of the highest violet-light radiant power peak radiant power must be present at all violet to blue-violet light wavelengths from this light source between 405 nm-440 nm in at least one operational mode.

The light beam from all parts of the light source intentionally diverge from the 20-30 degree range to provide a lower intensity peripheral lighted region of about 60-90 degrees that is useful for improving peripheral vision and reduces glare.

FIG. 7 shows a multiple spectral mode lamp light source assembly 50 according to another embodiment of the present disclosure, comprising a multiple spectral mode lamp including twelve 0.10-0.20 Watt 5 mm DIP LEDs. This lamp assembly comprises a housing 52 that may be in the form of a plastic casing including a rear battery compartment, and the housing as shown may include a tiltable hinge assembly 54 for adjustable positioning of the lamp assembly. A control switch (not shown in FIG. 7) may be provided on a rear portion of the housing.

The FIG. 7 lamp utilizes a multiplicity of LEDs to mix light and form spectra like that shown in FIGS. 1-3, depending on which of the specific ones of the multiple LEDs are turned. The lamp includes a transparent protective cover 56 that may overlie shaped reflectors associated with the LED elements of the lamp. The LEDs could be placed small fractions of a millimeters from each other on a multichip array, as may be desirable in specific embodiments. In this case the separate LED lenses provide about 50-60 degree primary beam spread which helps with light mixing when the LEDs are discrete and separated by several millimeters.

The lamp 50 shown in FIG. 7 in a specific embodiment may comprise independently actuatable subassemblies of LEDs, comprising: a subassembly of (i) three 440-450 nm LEDs with mixed 495 nm, 620 nm, and 650 nm phosphors, (ii) a subassembly of three 440-450 nm LEDs with mixed 495 nm and 590 nm phosphors; (iii) a subassembly of two 480 nm dominant peak LEDs and one centered 490 nm dominant peak LED; and (iv) a subassembly of three 390 nm or 405 nm dominant peak LEDs with mixed V570 dye and TOB in 0.3 mm thick dome polycarbonate covers.

In any of the above embodiments of this disclosure, additional LEDs (spectrum-converted and/or not spectrum-converted), may be added to the apparatus to increase the light intensity in certain portions of the light spectrum.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A light source configured to generate a light output for enhanced scotopic and mesopic visual acuity, said light source comprising (i) an array of LEDs, or (ii) one or more LEDs and one or more spectrum converters operatively arranged to convert light emitted by at least one of the one or more LEDs, wherein (i) the array of LEDs, or (ii) the one or more LEDs and the one or more spectrum converters, is constructed and arranged to produce a light output spectrum in said light output including radiant power peaks in the red spectral range of 630-730 nm, in the blue-violet spectral range of 375-465 nm, and in the cyan spectral range of 470-510 nm, and wherein in said light output spectrum produced by (i) the array of LEDs, or (ii) the one or more LEDs and the one or more spectrum converters, the radiant power of said light output spectrum in each of (a) the red spectral range of 630-730 nm of said light output spectrum, (b) the blue-violet spectral range of 375-465 nm of said light output spectrum, and (c) the cyan spectral range of 470-510 nm of said light output spectrum, is greater than (d) the radiant power in the yellow-green spectral range of 530-570 nm of said light output spectrum, wherein the light source is characterized by at least one characteristic or component selected from the group of characteristics or components consisting of:

a) the light source comprising one or more violet LEDs, and the one or more spectrum converters comprising one or more spectrum converter structures that absorb at least 20% of the emitted light from the one or more violet LEDs in the 375 nm-425 nm spectral range and emit light primarily within the 390 nm-520 nm spectral range;

b) the light source comprising one or more violet LEDs, and the one or more spectrum converters comprising one or more spectrum converter structures that absorb at least 20% of the emitted light from the one or more violet LEDs and emit light exhibiting one or more emission peaks in the 470 nm-530 nm spectral range.

c) the light source comprising one or more violet LEDs, and the one or more spectrum converters comprising one or more spectrum converter structures that absorb at least 20% of the emitted light from the one or more violet LEDs and emit light exhibiting one or more emission peaks in the 580 nm-730 nm spectral range, with the proviso that if this or these 580 nm-730 nm spectral peak(s) are below 630 nm, then the relative radiance at 640 nm must be at least 45% of the 580-630 nm spectral peak;

d) the one or more spectrum converters comprising one or more spectrum converter structures that absorb light primarily in the 520-580 nm spectral range and emit light primarily in the 580nm-780 nm range and that are arranged to reduce radiant power in the 530-570 nm spectral range while increasing radiant power in the over-580 nm spectral range;

e) the one or more spectrum converters comprising at least one of phosphor(s), fluorescent dye(s), and quantum dots, wherein the one or more spectrum converters are at least one of (i) in one or more translucent medium materials, and (ii) on one or more reflective medium materials;

the one or more spectrum converters comprising multiple spectrum converters arranged in parallel or in series, or in a combined parallel and series arrangement;

g) the one or more spectrum converters absorb over 30% and less than 85% of light from at least one of the one or more LEDs of the light source;

h) the one or more spectrum converters are in an optical path of light from at least one of the one or more LEDs of the light source to objects to be illuminated;

i) the light source comprising an optical arrangement wherein the one or more spectrum converters (i)-pass, (ii) emit, or (iii) pass and emit light (A) at all wavelengths in the 440-730 nm spectral range, or (B) at all wavelengths in the 405 nm-730 nm spectral range with at least at 6% of the highest radiant spectral peak provided at all wavelengths in said 405-730 nm spectral range;

j) the light output of the light source comprising average radiant power in the 530-570 nm spectral range that is no less than 6%, but no more than 45%, of radiant power of the highest peak in the overall light spectrum of the light source;

k) the one or more spectrum converters comprising at least one selected from the group consisting of fluorescent dyes, phosphorescent dyes, phosphors, and quantum dots, in one or more translucent medium materials, wherein intrinsic internal quantum yields (QY-i) of primary individual active color converting materials in the one or more spectrum converters are at least 60%; and l) the light source comprising one or more optical elements selected from the group consisting of photonic crystals, polarizers, gratings, reflectors, lenses, interference filters, and non-interference filters, wherein the one or more optical elements are arranged before or after at least one of the one or more spectrum converters, in an optical path of the light source.

2. A light source configured to generate a light output for enhanced scotopic and mesopic visual acuity, said light source comprising (i) an array of LEDs, or (ii) one or more LEDs and one or more spectrum converters operatively arranged to convert light emitted by at least one of the one or more LEDs, wherein (i) the array of LEDs, or (ii) the one or more LEDs and the one or more spectrum converters, is constructed and arranged to produce a light output spectrum in said light output including radiant power peaks in the red spectral range of 630-730 nm, in the blue-violet spectral range of 375-465 nm, and in the cyan spectral range of 470-510 nm, and wherein in said light output spectrum produced by (i) the array of LEDs, or (ii) the one or more LEDs and the one or more spectrum converters, the radiant power of said light output spectrum in each of (a) the red spectral range of 630-730 nm of said light output spectrum, (b) the blue-violet spectral range of 375-465 nm of said light output spectrum, and (c) the cyan spectral range of 470-510 nm of said light output spectrum, is greater than (d) the radiant power in the yellow-green spectral range of 530-570 nm of said light output spectrum, wherein said one or more spectrum converters are effective to increase cyan and yellow-green light output from blue and violet input light.

3. The light source according to claim 2, comprising:

a) one or more blue-violet LEDs exhibiting one or more dominant emission peaks in the 425 nm-465 nm spectral range;

b) spectrum converters in the light path of the 425 nm-465 nm dominant emission peak blue-violet LEDs, wherein the spectrum converters are primarily 425 nm-465 nm absorbing and provide one or more emission peaks in the primarily 470 nm-530 nm and in the 580 nm-730 nm spectral ranges; and c) an optical arrangement wherein the spectrum converters and the LEDs of the light source collectively emit said light output as light meeting at least one of spectral criteria of (I) the three highest radiant power intensity peaks of the light being in the spectral ranges of 630 nm-730 nm, 470 nm-510 nm, and 425 nm-465 nm, (II) the light comprising at least one orange spectral peak in the 580 nm-630 nm spectral range, and (III) the light comprising at least one radiant power spectral peak between 375 nm-405 nm, and wherein deep-violet or UV light provides at least 10% of the highest radiant power intensity peak in a 405 nm-730 nm spectral range of the light output of the light source.

4. The light source of claim 2, wherein said one or more spectrum converters comprise multiple-emission-spectrum spectrum converters arranged as a 2-D or 3-D array of discrete color-converter elements for each LED or group of LEDs of the one or more spectrum converters, and wherein the discrete color-converter elements have been formed by patterning and arranged in said arrays for generation of the light output of the light source.

5. The light source of claim 2, comprising an LED configuration of said LEDs selected from the group consisting of:

(i) configurations of multiple LEDs, wherein each LED in a group of LEDs in the multiple LEDs that is on in a given mode of operation is of a same LED type and emits a same output, and wherein switching modes turn on or off or change luminance of LEDs in at least one group of LEDs in the multiple LEDs; and (ii) configurations of multiple LEDs, wherein different types of LEDs are on at a same time in a given mode of operation.

6. The light source of claim 2, configured so that individual ones of the LEDs can be switched off or on or varied in intensity by changing power thereto.

7. The light source of claim 2, wherein said one or more spectrum converters comprise at least one of (i) violet light-absorbing phosphors or quantum dots, and (ii) blue light-absorbing phosphors or quantum dots, and wherein the light output spectrum comprises a peak light emission in the 475 -530 nm or the 580 -730 nm spectral range.

8. The light source of claim 2, wherein said one or more spectrum converters comprise: at least one of (i) violet light-absorbing phosphor, and (ii) blue light -absorbing phosphor, with a light emission spectrum in the 530 nm-570 nm spectral range; and YAG phosphor emitting in the 470 -510 nm spectral range.

9. The light source of claim 2, wherein said one or more spectrum converters comprise orange phosphor, with a light emission spectrum in the 580 nm-630 nm spectral range.

10. The light source of claim 2, wherein said one or more spectrum converters comprise (A) color converter material having an emission peak in the 480 -510 nm spectral range, and (B) color converter material having an emission peak in the 580 -600 nm spectral range, wherein the weight ratio of (A):(B) is in a range of from 20:1 to 1:10 that produces an emission spectrum including the 530-570 spectral range, and wherein the one or more spectrum converters further optionally includes phosphor having an emission spectrum including a range of 630-650 nm.

11. The light source of claim 2, wherein the LEDs comprise UV or violet LEDs having an emission spectrum in the 375 nm-420 nm spectral range, and said one or more spectrum converters comprise one or more fluorescent dyes that primarily absorb light in the UV, violet, or UV-violet spectral range and that emit light primarily in the violet, blue and the cyan spectral ranges.

12. The light source of claim 2, wherein the one or more spectrum converters comprise

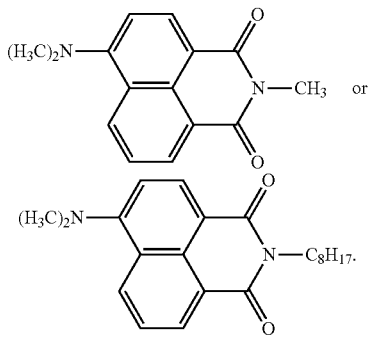

13. A light source configured to generate a light output for enhanced scotopic and mesopic visual acuity, said light source comprising (i) an array of LEDs, or (ii) one or more LEDs and one or more spectrum converters operatively arranged to convert light emitted by at least one of the one or more LEDs,
  wherein (i) the array of LEDs, or (ii) the one or more LEDs and the one or more spectrum converters, is constructed and arranged to produce a light output spectrum in said light output including radiant power peaks in the red spectral range of 630-730 nm, in the blue-violet spectral range of 375-465 nm, and in the cyan spectral range of 470-510 nm, and
wherein in said light output spectrum produced by (i) the array of LEDs, or (ii) the one or more LEDs and the one or more spectrum converters, the radiant power of said light output spectrum in each of (a) the red spectral range of 630-730 nm of said light output spectrum, (b) the blue-violet spectral range of 375-465 nm of said light output spectrum, and (c) the cyan spectral range of 470-510 nm of said light output spectrum, is greater than (d) the radiant power in the yellow-green spectral range of 530-570 nm of said light output spectrum, wherein the light source is comprised in a light source article selected from the group consisting of lamps, reading lights, body-mounted lights, flashlights, lanterns, architectural lighting articles, retail product lighting articles, signaling lights, horticultural lighting articles, streetlights, automotive lighting articles, home lighting articles, and bicycle lights.

14. The light source of claim 13, comprising at least one of:
  (a) the one or more spectrum converters comprising at least one spectrum converter selected from the group consisting of photonic crystals, phosphors, dyes, and color-converting quantum structures; and
  (b) a non-LED light source component selected from the group consisting of fluorescent, gas discharge, arc, plasma, halogen, incandescent, electroluminescent, cathodoluminescent, laser diode, and OLED light source components.

15. The light source of claim 13, comprising an optical structure providing spectral change with relative position in the light output, the optical structure comprising at least one of a focusing reflector and lens that produces center-weighted radiance and a primarily 10-30° cone angle light output from the light source, wherein the light source provides either (1) a 1.5-times or higher relative spectral radiant power of at least one of cyan light and red light in the periphery than the center of a beam of the light output and at least a 2 times lower intensity at the periphery over 50 degrees from center, or (2) a 1.5-times or higher relative spectral radiant power of at least one of cyan light and red light in the center of the light output beam than in the over-50 degrees periphery.

* * * * *

UNITED STATES PATENT AND TRADEMARK OFFICE
CERTIFICATE OF CORRECTION

| | | |
|---|---|---|
| PATENT NO. | : 9,551,468 B2 | Page 1 of 1 |
| APPLICATION NO. | : 14/262794 | |
| DATED | : January 24, 2017 | |
| INVENTOR(S) | : Gary W. Jones | |

It is certified that error appears in the above-identified patent and that said Letters Patent is hereby corrected as shown below:

In the Specification

Column 8, Line 14: "475 nm-510 mn cyan" should be --475 nm-510 nm cyan--.

Column 13, Line 31: "use for more" should be --use 1 or more--.

Column 28, Line 8: "Source Embodiment 3:" should be --Source Embodiment 4:--.

Column 28, Line 12: "Embodiment for 2 LEDs" should be --Embodiment 1 or 2 LEDs--.

Column 29, Line 51: "in FIG. 1, 2, or 3." should be --in FIGS. 1, 2, or 3.--.

Column 29, Line 54: "FIG. 1, 2, or 3," should be --FIGS. 1, 2, or 3,--.

Signed and Sealed this
Twenty-first Day of March, 2017

Michelle K. Lee
*Director of the United States Patent and Trademark Office*